United States Patent
Jo et al.

(10) Patent No.: US 12,261,191 B2
(45) Date of Patent: Mar. 25, 2025

(54) DISPLAY DEVICE HAVING A PAD PART DISPOSED ON A BARRIER LAYER, METHOD OF MANUFACTURING THE SAME AND TILED DISPLAY DEVICE INCLUDING THE SAME

(71) Applicant: Samsung Display Co., Ltd., Yongin-Si (KR)

(72) Inventors: Jung Yun Jo, Namyangju-si (KR); Kwang Hyun Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 497 days.

(21) Appl. No.: 17/526,009

(22) Filed: Nov. 15, 2021

(65) Prior Publication Data

US 2022/0285428 A1    Sep. 8, 2022

(30) Foreign Application Priority Data

Mar. 2, 2021    (KR) .......................... 10-2021-0027203

(51) Int. Cl.
*H01L 27/15* (2006.01)
*H01L 33/00* (2010.01)
*H01L 33/50* (2010.01)

(52) U.S. Cl.
CPC .......... *H01L 27/156* (2013.01); *H01L 33/005* (2013.01); *H01L 33/50* (2013.01)

(58) Field of Classification Search
CPC ...... H10K 59/18; H10K 59/19; H10K 59/871; H10K 59/8722; H01L 27/00–10
See application file for complete search history.

(56) References Cited

U.S. PATENT DOCUMENTS

| | | | |
|---|---|---|---|
| 2009/0009705 A1* | 1/2009 | Tomiyasu | H01L 27/1251 257/E27.111 |
| 2011/0122486 A1* | 5/2011 | Busch | A61N 1/37512 359/359 |
| 2016/0329386 A1* | 11/2016 | Sauers | H10K 71/00 |
| 2018/0218668 A1* | 8/2018 | Aoyagi | G09G 3/32 |
| 2019/0187003 A1* | 6/2019 | Brunnett | G01K 1/10 |
| 2020/0211929 A1* | 7/2020 | Son | G09F 9/3026 |
| 2022/0208909 A1* | 6/2022 | Jeon | H10K 59/122 |
| 2022/0262891 A1* | 8/2022 | Liang | G06F 3/1446 |

FOREIGN PATENT DOCUMENTS

| KR | 10-2018-0100013 A | 9/2018 |
|---|---|---|
| KR | 10-2019-0048642 A | 5/2019 |
| KR | 10-1957998 B1 | 7/2019 |

\* cited by examiner

*Primary Examiner* — Vu A Vu
*Assistant Examiner* — Jeremy Daniel Watts
(74) *Attorney, Agent, or Firm* — Innovation Counsel LLP

(57) ABSTRACT

Provided is a display device. The display device comprises a first substrate, a barrier layer disposed on the first substrate and having amorphous carbon, a first pad part disposed on the barrier layer, a second substrate disposed on the first pad part, a display layer disposed on the second substrate, and a second pad part disposed on a bottom surface of the first substrate and inserted into a first contact hole formed in the first substrate and the barrier layer.

14 Claims, 31 Drawing Sheets

DISPLAY DEVICE HAVING A PAD PART DISPOSED ON A BARRIER LAYER, METHOD OF MANUFACTURING THE SAME AND TILED DISPLAY DEVICE INCLUDING THE SAME

CROSS-REFERENCE TO RELATED APPLICATION

This application claims priority from Korean Patent Application No. 10-2021-0027203 filed on Mar. 2, 2021, in the Korean Intellectual Property Office, and all the benefits accruing therefrom under 35 U.S.C. 119, the contents of which in its entirety are herein incorporated by reference.

BACKGROUND

1. Technical Field

The present disclosure generally relates to a display device, a method of manufacturing the same, and a tiled display device including the same. More particularly, the present disclosure relates to a display device capable of preventing damage to a pad part, preventing particles from being generated on the bottom surface of the pad part, and preventing a film lifting phenomenon of the pad part, a method of manufacturing the same, and a tiled display device including the same.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, since each of pixels of a display panel includes a light emitting element capable of emitting light by itself, an image can be displayed without a backlight unit providing light to the display panel.

When the display device is manufactured in a large size, a defect rate of the light emitting element may increase due to an increase in the number of pixels, thereby deteriorating productivity or reliability of the display device. To solve this problem, in a tiled display device, a large-sized screen may be implemented by connecting a plurality of display devices having a relatively small size. The tiled display device may include a boundary portion called a seam between the plurality of display devices, due to a non-display area or a bezel area of each of the plurality of display devices adjacent to each other. When a single image is displayed on the entire screen, the boundary portion between the plurality of display devices gives a sense of disconnection over the entire screen, thereby reducing a sense of immersion in the image.

SUMMARY

Aspects of the present disclosure provide a display device capable of preventing damage to a pad part, preventing particles from being generated on the bottom surface of the pad part, and preventing a film lifting phenomenon of the pad part in a process of forming a contact hole that penetrates a substrate to expose the bottom surface of the pad part disposed on the substrate, a method of manufacturing the same, and a tiled display device including the same.

Aspects of the present disclosure also provide a tiled display device capable of removing a sense of disconnection between a plurality of display devices and improving a sense of immersion in an image, by preventing the recognition of boundary portions or non-display areas between the plurality of display devices.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the present disclosure, a display device comprises a first substrate, a barrier layer disposed on the first substrate and having amorphous carbon, a first pad part disposed on the barrier layer, a second substrate disposed on the first pad part, a display layer disposed on the second substrate, and a second pad part disposed on a bottom surface of the first substrate and inserted into a first contact hole formed in the first substrate and the barrier layer.

The display device may further comprise a first barrier insulating layer disposed between the first substrate and the barrier layer, the first contact hole formed in the first barrier insulating layer.

With respect to fluorine-based gas, an etching rate of the first barrier insulating layer may be higher than an etching rate of the barrier layer.

The display device may further comprise a second barrier insulating layer disposed between the first pad part and the second substrate.

Each of the first and second barrier insulating layers may include at least one of a silicon nitride layer, a silicon oxynitride layer, a silicon oxide layer, a titanium oxide layer, or an aluminum oxide layer.

The display device may further comprise a first connection line disposed on the second substrate and connected to the first pad part through a second contact hole formed in the second substrate and the second barrier insulating layer.

The display layer may include a thin film transistor layer disposed on the second substrate and including a thin film transistor, a light emitting element layer disposed on the thin film transistor layer and including a light emitting element, and a wavelength conversion layer disposed on the light emitting element layer to convert a wavelength of light emitted from the light emitting element.

The display device may further comprise a flexible film disposed on the bottom surface of the first substrate and connected to a bottom surface of the second pad part, and a data driver disposed on the flexible film configured to supply a data voltage to the first pad part.

The display device may further comprise: a second barrier insulating layer disposed on the barrier layer, a third barrier insulating layer disposed between the second barrier insulating layer and the second substrate, and a first connection line on the second substrate and connected to the first pad part through a second contact hole formed in the second substrate and the third barrier insulating layer.

The first pad part may be disposed on the second barrier insulating layer, and may be inserted into a third contact hole provided in the second barrier insulating layer to be contact with the barrier layer.

An etching rate of the barrier layer with respect to oxygen gas may be higher than an etching rate of the barrier layer with respect to fluorine-based gas.

The barrier layer may be patterned to correspond to the first pad part.

According to an embodiment of the present disclosure, a method of manufacturing a display device comprises steps of providing a carrier substrate and a first substrate disposed on the carrier substrate, forming a barrier layer disposed on the first substrate and containing amorphous carbon, forming a first pad part on the barrier layer, forming a second substrate disposed on the first pad part, forming a first contact hole in the first substrate and the barrier layer by patterning the first substrate and the barrier layer, and forming a second pad part on a bottom surface of the first substrate and inserted into the first contact hole to be connected to the first pad part.

The method of manufacturing a display device may further comprise a step of forming a first barrier insulating layer between the first substrate and the barrier layer. The forming of the first contact hole may be accomplished by patterning the first barrier insulating layer through a dry etching process using fluorine-based gas, and patterning the barrier layer through an ashing process using oxygen gas.

The method of manufacturing a display device may further comprise steps of forming a second barrier insulating layer disposed between the first pad part and the second substrate, forming a second contact hole in the second substrate and the second barrier insulating layer by patterning the second substrate and the second barrier insulating layer, and forming a first connection line disposed on the second substrate and connected to the first pad part through a second contact hole formed in the second substrate and the second barrier insulating layer.

The method of manufacturing a display device may further comprise a step of forming a second barrier insulating layer disposed on the barrier layer. The forming of the first pad part may comprise forming a first pad part disposed on the second barrier insulating layer and inserted into a third contact hole provided in the second barrier insulating layer to be direct contact with the barrier layer.

The forming of the first contact hole may include simultaneously etching the first substrate and the barrier layer through a dry etching process using oxygen gas.

The forming of the barrier layer may include patterning the barrier layer to correspond to a region where the first pad part is formed.

According to an embodiment of the present disclosure, a tiled display device comprises a plurality of display devices, each including a display area including a plurality of pixels and a non-display area surrounding the display area, and a bonding member configured to bond the plurality of display devices. Each of the plurality of display devices includes a first substrate, a barrier layer disposed on the first substrate and having amorphous carbon, a first pad part disposed on the barrier layer, a second substrate disposed on the first pad part, a display layer disposed on the second substrate, and a second pad part disposed on a bottom surface of the first substrate and inserted into a first contact hole formed in the first substrate and the barrier layer.

Each of the plurality of display devices may further include a first barrier insulating layer disposed between the first substrate and the barrier layer, the first contact hole formed in the first barrier insulating layer. With respect to fluorine-based gas, an etching rate of the first barrier insulating layer may be higher than an etching rate of the barrier layer.

In accordance with the display device, the method of manufacturing method the same, and the tiled display device including the same according to embodiments, since a barrier layer disposed on the substrate and containing amorphous carbon and the pad part disposed on the barrier layer are included, it is possible to prevent damage to the pad part, prevent particles from being generated on the bottom surface of the pad part, and prevent the film lifting phenomenon of the pad part in the process of forming the contact hole that penetrates the substrate to expose the pad part.

In accordance with the display device, the method of manufacturing method the same, and the tiled display device including the same according to embodiments, it is possible to minimize the non-display area of the display device in size by electrically connecting a first pad part disposed on the substrate to a flexible film disposed on the bottom surface of the substrate through a second pad part disposed on the bottom surface of the substrate. Accordingly, in the tiled display device, by minimizing the gap between the plurality of display devices, it is possible to prevent a user from recognizing the boundary portions or the non-display areas between the plurality of display devices.

However, the effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
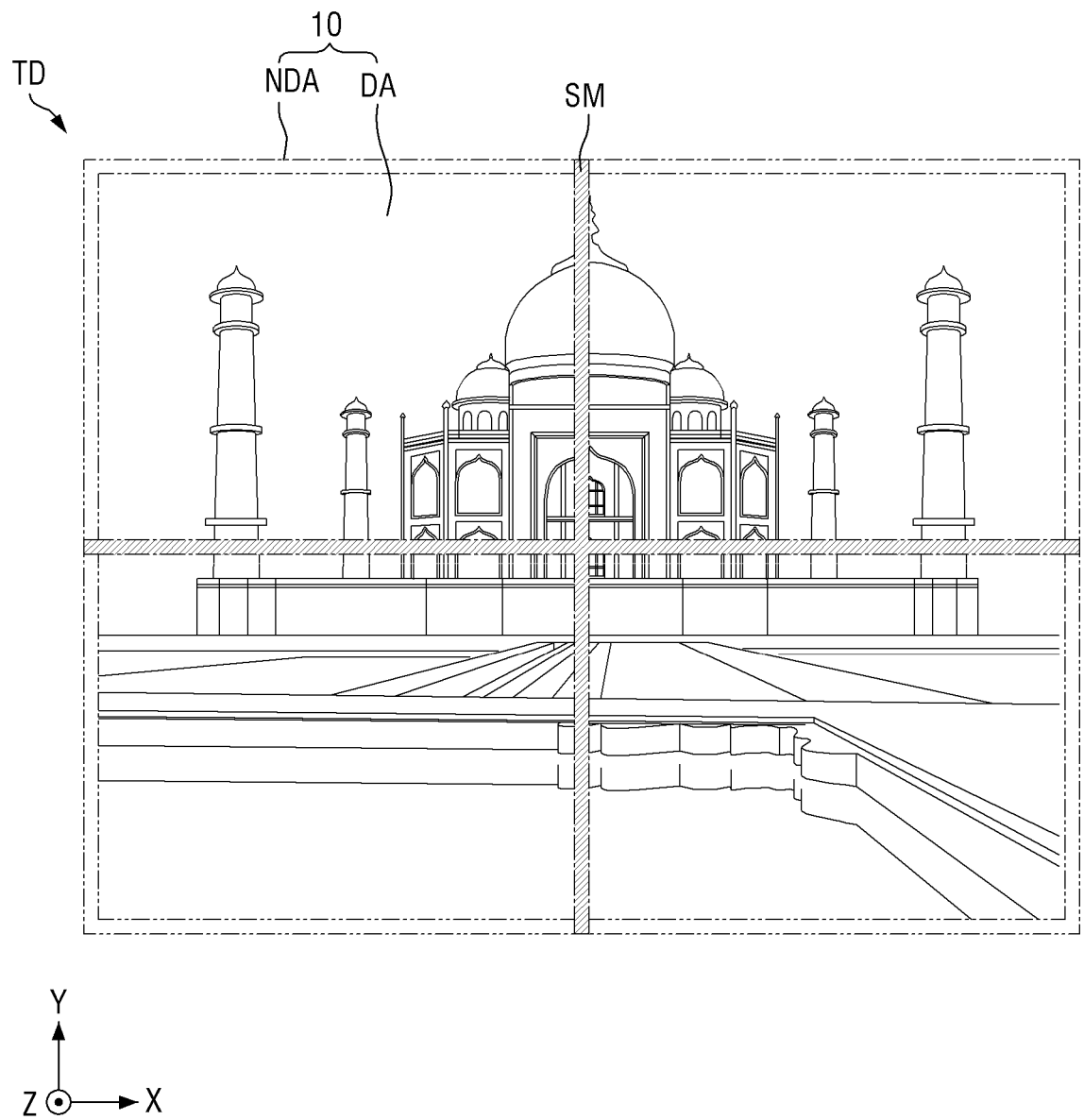
FIG. 1 is a plan view illustrating a tiled display device according to one embodiment.

FIG. 1 is a plan view illustrating a tiled display device according to one embodiment.

Referring to FIG. 1, a tiled display device TD may include a plurality of display devices 10. The plurality of display devices 10 may be arranged in a grid form, but are not limited thereto. The plurality of display devices 10 may be connected in a first direction (X-axis direction) or a second direction (Y-axis direction), and the tiled display device TD may have a particular shape. For example, the plurality of display devices 10 may have the same size, but are not limited thereto. For another example, the plurality of display devices 10 may have different sizes.

Each of the plurality of display devices 10 may have a rectangular shape including long sides and short sides. The plurality of display devices 10 may be arranged such that the long sides or the short sides thereof are connected to each other. Some of the display devices 10 may be disposed at the edge of the tiled display device TD to form one side of the tiled display device TD. Some others of the display devices 10 may be disposed at corners of the tiled display device TD to form two adjacent sides of the tiled display device TD. Yet some others of the display devices 10 may be disposed on the inner side of the tiled display device TD, and may be surrounded by other display devices 10.

Each of the plurality of display devices 10 may include a display area DA and a non-display area NDA. The display area DA may include a plurality of pixels to display an image. Each of the plurality of pixels may include an organic light emitting diode including an organic light emitting layer, a micro LED, a quantum dot light emitting diode including a quantum dot light emitting layer, or an inorganic light emitting element including an inorganic semiconductor. In the following, the case where each of the plurality of pixels includes an inorganic light emitting element will be mainly described, but the present disclosure is not limited thereto. The non-display area NDA may be disposed around the display area DA to surround the display area DA, and may not display an image.

The tiled display device TD may have a planar shape as a whole, but is not limited thereto. The tiled display device TD may have a three-dimensional shape to provide a three-dimensional effect to a user. For example, when the tiled display device TD has a three-dimensional shape, at least some of the plurality of display devices 10 may have a curved shape. For another example, the plurality of display devices 10 may each have a planar shape and may be connected to each other at a predetermined angle, so that the tiled display device TD may have a three-dimensional shape.

The tiled display device TD may include a coupling area SM disposed between a plurality of display areas DA. The tiled display device TD may be formed by connecting non-display areas NDA of the adjacent display devices 10. The plurality of display devices 10 may be connected to each other through a bonding member or an adhesive member disposed in the coupling area SM. The coupling area SM of each of the plurality of display devices 10 may not include a pad part or a flexible film attached to the pad part. Accordingly, the distance between the display areas DA of the plurality of display devices 10 may be small enough that the coupling area SM between the plurality of display devices 10 is not recognized by the user. In addition, the reflectance of external light of the display areas DA of the plurality of display devices 10 may be substantially the same as that of the coupling area SM between the plurality of display devices 10. Accordingly, in the tiled display device TD, the coupling area SM between the plurality of display devices 10 may be prevented from being recognized by the user, thereby reducing a sense of disconnection between the plurality of display devices 10 and improving a sense of immersion in an image.

Figure 2:
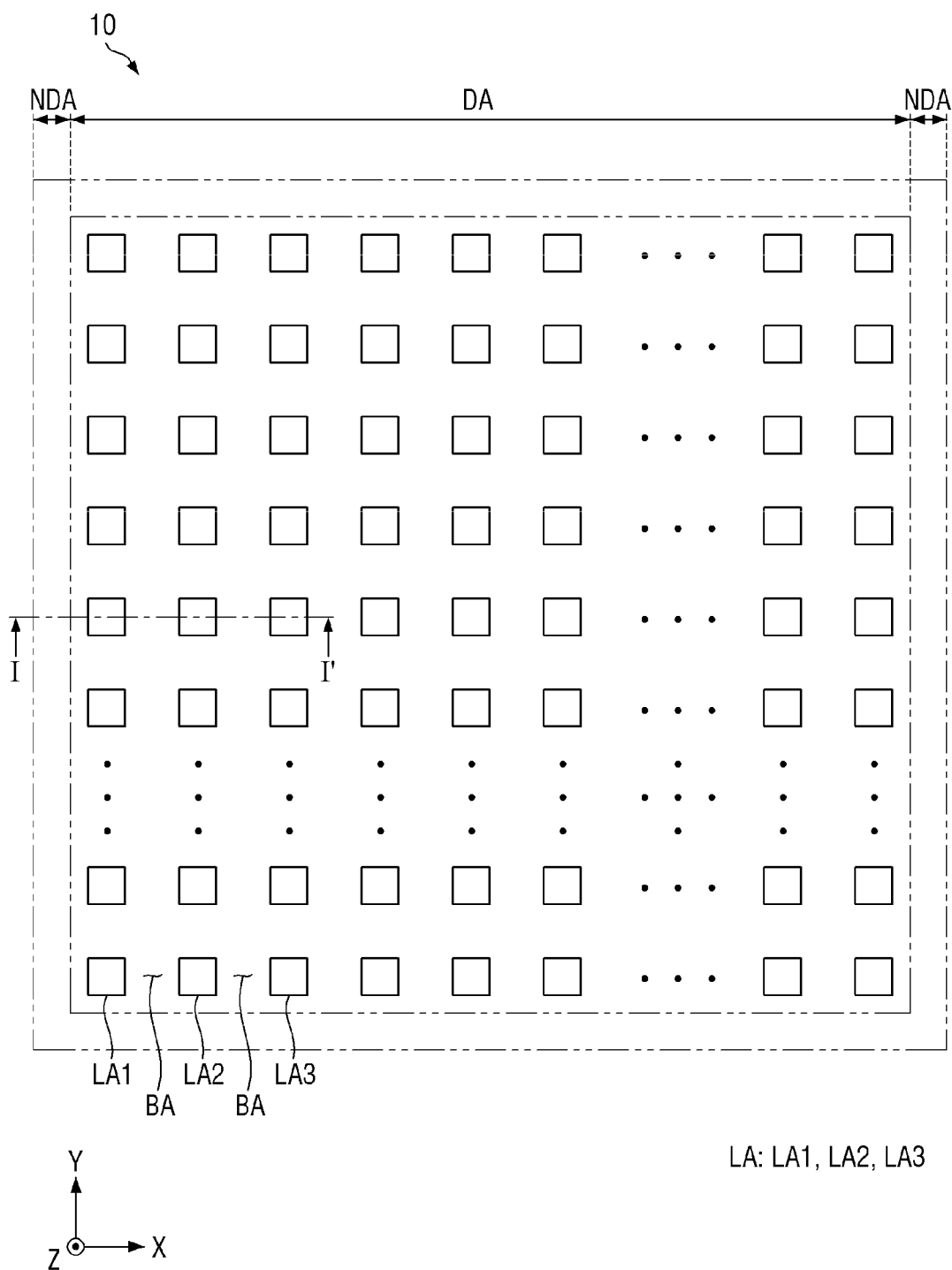
FIG. 2 is a plan view illustrating a display device according to one embodiment.

FIG. 2 is a plan view illustrating a display device according to one embodiment.

Referring to FIG. 2, the display device 10 may include a plurality of pixels arranged along a plurality of rows and columns in the display area DA. Each of the plurality of pixels may include an emission area LA defined by a pixel defining layer or bank, and may emit light having a predetermined peak wavelength through the emission area LA. For example, the display area DA of the display device 10 may include first, second, and third emission areas LA1, LA2, and LA3. Each of the first, second, and third emission areas LA1, LA2, and LA3 may be an area in which light generated from a light emitting element of the display device 10 is emitted to the outside of the display device 10.

The first, second, and third emission areas LA1, LA2, and LA3 may emit light having a predetermined peak wavelength to the outside of the display device 10. The first emission area LA1 may emit light of a first color, the second emission area LA2 may emit light of a second color, and the third emission area LA3 may emit light of a third color. For example, the first color light may be red light having a peak wavelength in the range from 610 nm to 650 nm, the second color light may be green light having a peak wavelength in the range from 510 nm to 550 nm, and the third color light may be blue light having a peak wavelength in the range from 440 nm to 480 nm, but the present disclosure is not limited thereto.

The first, second, and third emission areas LA1, LA2, and LA3 may be sequentially arranged repetitively in the first direction (X-axis direction) in the display area DA. For example, the first emission area LA1 may be larger in size than the second emission area LA2, the second emission area LA2 may be larger in size than the third emission area LA3, and the first emission area LA1 may be larger in size than the third emission area LA3. For another example, the first emission area LA1, the second emission area LA2, and the third emission area LA3 may be substantially the same in size.

The display area DA of the display device 10 may include a light blocking area BA surrounding the plurality of emission areas LA. The light blocking area BA may prevent the colored lights emitted from the first, second, and third emission areas LA1, LA2, and LA3 from mixing with one another.

Figure 3:
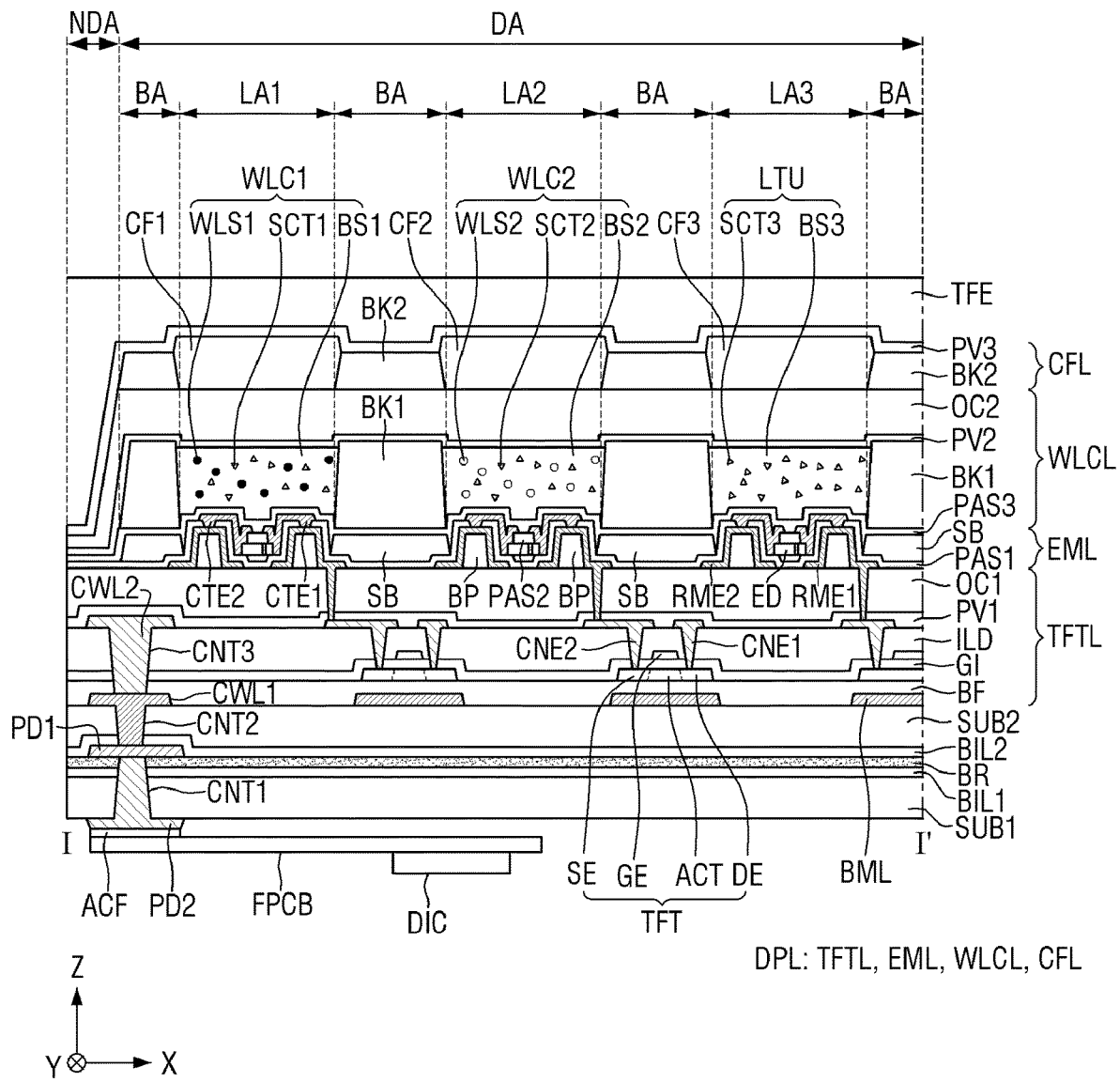
FIG. 3 is a cross-sectional view of an example taken along line I-I' of FIG. 2.
Figure 4:
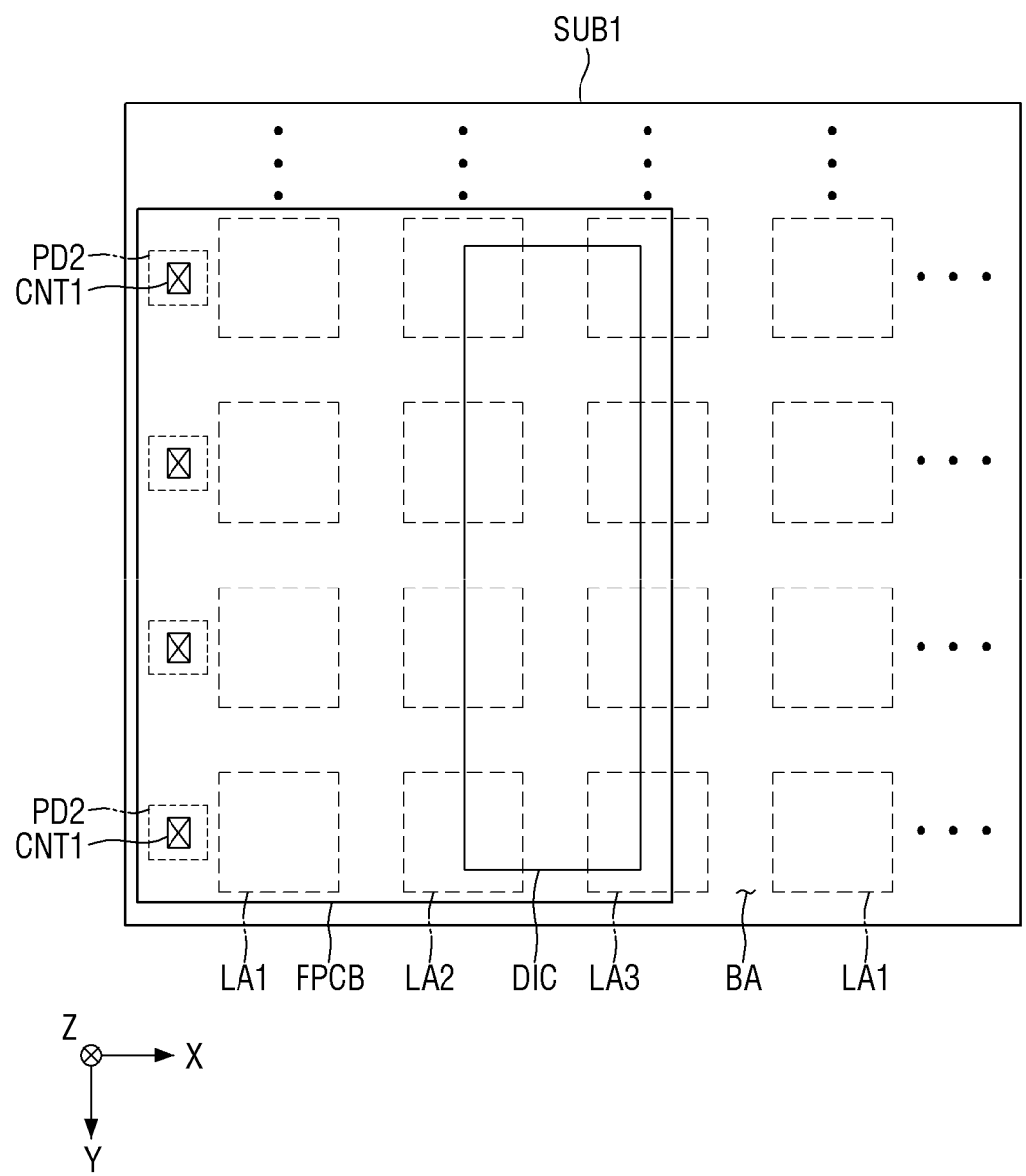
FIG. 4 is a bottom view showing a display device according to one embodiment.

FIG. 3 is a cross-sectional view of an example taken along line I-I' of FIG. 2, and FIG. 4 is a bottom view showing a display device according to one embodiment.

Referring to FIGS. 3 and 4, the display area DA of the display device 10 may include first, second, and third emission areas LA1, LA2, and LA3. Each of the first, second, and third emission areas LA1, LA2, and LA3 may be an area in which light generated from the light emitting element ED of the display device 10 is emitted to the outside of the display device 10.

The display device 10 may include a first substrate SUB1, a first barrier insulating layer BIL1 a barrier layer BR, a first pad part PD1, a second barrier insulating layer BIL2, a second substrate SUB2, a display layer DPL, an encapsulation layer TFE, a second pad part PD2, a connection film ACF, a flexible film FPCB, and a data driver DIC.

The first substrate SUB1 may support the display device 10. The first substrate SUB1 may be a base substrate or a base member. The first substrate SUB1 may be a flexible substrate which can be bent, folded or rolled. For example, the first substrate SUB1 may include an insulating material such as a polymer resin such as polyimide (PI), but the present disclosure is not limited thereto.

The first barrier insulating layer BIL1 may be disposed on the first substrate SUB1. The first barrier insulating layer BIL1 may include an inorganic layer capable of preventing permeation of air or moisture. For example, the first barrier insulating layer BIL1 may include at least one of a silicon nitride layer, a silicon oxynitride layer, a silicon oxide layer, a titanium oxide layer, or an aluminum oxide layer, but the present disclosure is not limited thereto.

The barrier layer BR may be disposed on the first barrier insulating layer BILL The barrier layer BR may be deposited on the first barrier insulating layer BIL1 using plasma enhanced chemical vapor deposition (PECVD), but the present disclosure is not limited thereto. The barrier layer BR may protect the bottom surface of the first pad part PD1 in a process of forming a first contact hole CNT1. The barrier layer BR may contain amorphous carbon. The barrier layer BR may be patterned by an ashing process using oxygen gas ($O_2$ gas). The barrier layer BR may have a high etching selectivity with respect to fluorine-based gas (F-gas). For example, with respect to the fluorine-based gas (F-gas), the etching rate of the first barrier insulating layer BIL1 may be considerably higher than the etching rate of the barrier layer BR. The etching rate of the barrier layer BR with respect to oxygen gas ($O_2$ gas) may be considerably higher than the etching rate of the barrier layer BR with respect to fluorine-based gas (F-gas). Therefore, the barrier layer BR may protect the bottom surface of the first pad part PD1 in the etching process of the first barrier insulating layer BIL1 using the fluorine-based gas (F-gas) to prevent damage to the first pad part PD1 and prevent particles from being generated on the bottom surface of the first pad part PD1.

When the first pad part PD1 is directly disposed on the first substrate SUB1, an interface having weak adhesive strength is formed between the first pad part PD1 and the first substrate SUB1 and, thus, the film lifting phenomenon of the first pad part PD1 may occur in the manufacturing process of the display device 10. Since the display device 10 includes the first pad part PD1 disposed on the barrier layer BR, it is possible to prevent the film lifting mechanism of the first pad part PD1 in the manufacturing process of the display device 10.

The transparency of the barrier layer BR may be adjusted based on process parameters. For example, the Tauc gap of the barrier layer BR may be 1.9 to 2.4 eV. Here, the Tauc gap may be a specific energy corresponding to the optical band gap of the barrier layer BR. When the Tauc gap of the barrier layer BR is 1.9 eV, the barrier layer BR as a transparent layer may transmit light. When the Tauc gap of the barrier layer BR is 2.4 eV, the barrier layer BR as a black layer may block light. The light transmittance of the barrier layer BR with respect to light having a wavelength of 400 nm may be 55% to 80%, but the present disclosure is not limited thereto.

For example, the refractive index of the barrier layer BR with respect to light having a wavelength of 633 nm may be 1.64 to 1.76, but the present disclosure is not limited thereto. The stress of the barrier layer BR may be −440 Mpa to −200 Mpa, but the present disclosure is not limited thereto. The contact angle of the barrier layer BR may be about 92 degrees.

The first contact hole CNT1 may be defined in the first substrate SUB1, and the first barrier insulating layer BILL and the barrier layer BR. The first contact hole CNT1 may be patterned from the bottom surface of the first substrate SUB1 to penetrate the top surface of the barrier layer BR. For example, the lower width of the first contact hole CNT1 may be greater than the upper width of the first contact hole CNT1.

The first pad part PD1 may be disposed on one surface or the top surface of the barrier layer BR. The first pad part PD1 may not be inserted into the first contact hole CNT1. The first pad part PD1 may be connected to a first connection line CWL1 inserted into a second contact hole CNT2. The first pad part PD1 may be electrically connected to the flexible film FPCB through the second pad part PD2 inserted into the first contact hole CNT1. The first pad part PD1 may supply the electrical signal received from the flexible film FPCB to the first connection line CWL1.

The second barrier insulating layer BIL2 may be disposed on the barrier layer BR and the first pad part PD1. The second barrier insulating layer BIL2 may include an inorganic layer capable of preventing permeation of air or moisture. For example, the second barrier insulating layer BIL2 may include at least one of a silicon nitride layer, a silicon oxynitride layer, a silicon oxide layer, a titanium oxide layer, or an aluminum oxide layer, but the present disclosure is not limited thereto.

The second substrate SUB2 may be disposed on the second barrier insulating layer BIL2. The second substrate SUB2 may be a base substrate or a base member. The second substrate SUB2 may be a flexible substrate which can be bent, folded or rolled. For example, the second substrate SUB2 may include an insulating material such as a polymer resin such as polyimide (PI), but the present disclosure is not limited thereto.

The second contact hole CNT2 may be defined in the second barrier insulating layer BIL2 and the second substrate SUB2. The second contact hole CNT2 may be etched from the top surface of the second substrate SUB2 to penetrate the bottom surface of the second barrier insulating layer BIL2. For example, the upper width of the second contact hole CNT2 may be greater than the lower width of the second contact hole CNT2. The second contact hole CNT2 may overlap the first contact hole CNT1 in a thickness direction (Z-axis direction), but the present disclosure is not limited thereto.

The display layer DPL may be disposed on the second substrate SUB2. The display layer DPL may include the thin film transistor layer TFTL, a light emitting element layer EML, a wavelength conversion layer WLCL and a color filter layer CFL. The thin film transistor layer TFTL may include a light blocking layer BML, the first connection line CWL1, a buffer layer BF, a thin film transistor TFT, a gate insulating layer GI, an interlayer insulating layer ILD, first and second connection electrodes CNE1 and CNE2, a second connection line CWL2, a first passivation layer PV1, and a first planarization layer OC1.

The light blocking layer BML may be disposed on the second substrate SUB2. The light blocking layer BML may overlap the thin film transistor TFT in the thickness direction (Z-axis direction) to block external light incident on the thin film transistor TFT. For example, the light blocking layer BML may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The first connection line CWL1 may be disposed on the second substrate SUB2 and be spaced apart from the light blocking layer BML along the first direction (X-axis direction). The first connection line CWL1 may be made of the same material as that of the light blocking layer BML. The first connection line CWL1 may be inserted into the second contact hole CNT2 and connected to the first pad part PD1.

The first connection line CWL1 may supply the electrical signal received from the first pad part PD1 to the thin film transistor layer TFTL.

The buffer layer BF may be disposed on the light blocking layer BML, the first connection line CWL1, and the second substrate SUB2. The third contact hole CNT3 is defined in the buffer layer BF, and the second connection line CWL2 is inserted into the first connection line CW1. The buffer layer BF may include an inorganic material capable of preventing permeation of air or moisture. For example, the buffer layer BF may include a plurality of inorganic layers laminated alternately.

The thin film transistor TFT may be disposed on the buffer layer BF, and may constitute a pixel circuit of each of the plurality of pixels. For example, the thin film transistor TFT may be a switching transistor or a driving transistor of the pixel circuit. The thin film transistor TFT may include a semiconductor region ACT, a gate electrode GE, a source electrode SE, and a drain electrode DE.

The semiconductor region ACT, the drain electrode DE, and the source electrode SE may be arranged on the buffer layer BF. The semiconductor region ACT may overlap the gate electrode GE in the thickness direction (Z-axis direction), and may be insulated from the gate electrode GE by the gate insulating layer GI. The drain electrode DE and the source electrode SE may be provided by making a material of the semiconductor region ACT conductive.

The gate electrode GE may be disposed on the gate insulating layer GI. The gate electrode GE may overlap the semiconductor region ACT, and the gate insulating layer GI is interposed therebetween.

The gate insulating layer GI may be disposed on the semiconductor region ACT, the drain electrode DE, and the source electrode SE. For example, the gate insulating layer GI may cover the semiconductor region ACT, the drain electrode DE, the source electrode SE, and the buffer layer BF, and may insulate the semiconductor region ACT and the gate electrode GE. The third contact hole CNT3 may be defined in the gate insulating layer GI, and the second connection line CWL2 is inserted into the third contact hole CNT3. The gate insulating layer GI may include a contact hole through which each of the first and second connection electrodes CNE1 and CNE2 passes.

The interlayer insulating layer ILD may be disposed on the gate electrode GE. The third contact hole CNT3 may be defined in the interlayer insulating layer ILD, and the second connection line CWL2 is inserted into the third contact hole CNT3. Therefore, the third contact hole CNT3 may penetrate the interlayer insulating layer ILD, the gate insulating layer GI, and the buffer layer BF. Some contact holes are defined in the interlayer insulating layer ILD and each of the first and second connection electrodes CNE1 and CNE2 passes through the contact holes.

The first and second connection electrodes CNE1 and CNE2 may be disposed to be spaced apart from each other on the interlayer insulating layer ILD. The first connection electrode CNE1 may connect a data line or a power line to the drain electrode DE of the thin film transistor TFT. The first connection electrode CNE1 may be in contact with the drain electrode DE through the contact hole provided in the interlayer insulating layer ILD and the gate insulating layer GI.

The second connection electrode CNE2 may connect the source electrode SE of the thin film transistor TFT to a first electrode RME1. The second connection electrode CNE2 may be in direct contact with the source electrode SE through the contact hole formed in the interlayer insulating layer ILD and the gate insulating layer GI.

The second connection line CWL2 may be disposed on the interlayer insulating layer ILD and disposed to be spaced apart from the first and second connection electrodes CNE1 and CNE2 along the first direction (X-axis direction). The second connection line CWL2 may be formed in the same layer as the first and second connection electrodes CNE1 and CNE2 and may be made of the same material as those of the first and second connection electrodes CNE1 and CNE2. The second connection line CWL2 may be inserted into the third contact hole CNT3 and connected to the first connection line CWL1 disposed on the second substrate SUB2.

For example, the second connection line CWL2 may be connected to the data line to supply a data voltage to the thin film transistor TFT. In another example, the second connection line CLW2 may be connected to the power line to supply a power voltage to the thin film transistor TFT.

In another example, the second connection line CWL2 may be disposed on the gate insulating layer GI, and the third contact hole CNT3 may be formed through the gate insulating layer GI and the buffer layer BF. In this case, the second connection line CWL2 may be connected to a gate line to supply a gate signal to the thin film transistor TFT.

The first passivation layer PV1 may be disposed on the first and second connection electrodes CNE1 and CNE2, the second connection line CWL2, and the interlayer insulating layer ILD. The first passivation layer PV1 may protect the thin film transistor TFT. The first passivation layer PV1 may include a contact hole through which the first electrode RME1 passes.

The first planarization layer OC1 may be disposed on the first passivation layer PV1 to flatten the upper end of the thin film transistor layer TFTL. For example, the first planarization layer OC1 may include a contact hole through which the first electrode RME1 passes. Here, the contact hole of the first planarization layer OC1 may be connected to the contact hole of the first passivation layer PV1. The first planarization layer OC1 may contain an organic insulating material such as polyimide (PI).

The light emitting element layer EML may be disposed on the thin film transistor layer TFTL. The light emitting element layer EML may include a protruding pattern BP, the first electrode RME1, a second electrode RME2, a first insulating layer PAS1, the light emitting element ED, a second insulating layer PAS2, a first contact electrode CTE1, a second contact electrode CTE2, a sub-bank SB, and a third insulating layer PASS.

The protruding pattern BP may be disposed on the first planarization layer OC1. The protruding pattern BP may protrude from the top surface of the first planarization layer OC1. A plurality of protruding patterns BP may be disposed in an opening area or the emission area LA of each of the plurality of pixels. A plurality of light emitting elements ED may be arranged between the plurality of protruding patterns BP. The protruding pattern BP may have inclined side surfaces, and the light emitted from the plurality of light emitting elements ED may be reflected by the first and second electrodes RME1 and RME2 arranged on the protruding patterns BP. For example, the protruding pattern BP may include an organic insulating material such as polyimide (PI).

The first electrode RME1 may be disposed on the first planarization layer OC1 and the protruding pattern BP. The first electrode RME1 may be disposed on the protruding pattern BP located on one side of the plurality of light emitting elements ED. The first electrode RME1 may be disposed on the inclined surfaces of the protruding pattern BP and reflect the light emitted from the light emitting element ED. The first electrode RME1 may be inserted into the contact hole provided in the first planarization layer OC1 and connected to the second connection electrode CNE2. The first electrode RME1 may be electrically connected to one end of the light emitting element ED through the first contact electrode CTE1. For example, the first electrode RME1 may receive a voltage that is proportional to the luminance of the light emitting element ED from the pixel circuit of the pixel.

The second electrode RME2 may be disposed on the first planarization layer OC1 and the protruding pattern BP. The second electrode RME2 may be disposed on the protruding pattern BP located on the other side of the plurality of light emitting elements ED. The second electrode RME2 may be disposed on the inclined surfaces of the protruding pattern BP and reflect the light emitted from the light emitting element ED. The second electrode RME2 may be electrically connected to the other end of the light emitting element ED through the second contact electrode CTE2. For example, the second electrode RME2 may receive a low potential voltage supplied from a low potential line to all the pixels.

The first and second electrodes RME1 and RME2 may contain a conductive material having high reflectivity. For example, the first and second electrodes RME1 and RME2 may contain at least one of silver (Ag), copper (Cu), aluminum (Al), nickel (Ni), or lanthanum (La). In another example, the first and second electrodes RME1 and RME2 may contain a material such as ITO, IZO, ITZO, or the like. In another example, the first and second electrodes RME1 and RME2 may contain a plurality of layers including a transparent conductive material layer and a metal layer having high reflectivity, or may include one layer containing a transparent conductive material or a metal having high reflectivity. The first and second electrodes RME1 and RME2 may have a stacked structure of ITO/Ag/ITO, ITO/Ag/IZO, ITO/Ag/ITZO/IZO, or the like.

The first insulating layer PAS1 may be disposed on the first planarization layer OC1, and the first and second electrodes RME1 and RME2. The first insulating layer PAS1 may protect and insulate the first electrode RME1 and the second electrode RME2 from each other. The first insulating layer PAS1 may prevent damage caused by direct contact between the light emitting element ED and the first and second electrodes RME1 and RME2 in an alignment process of the light emitting element ED.

The sub-bank SB may be disposed in the light blocking area BA along the thickness direction (Z-axis direction) and may be disposed on the first insulating layer PAS1 along the first direction (X-axis direction). The sub-bank SB may be disposed at the boundary of the plurality of pixels to distinguish the light emitting elements ED of each of the plurality of pixels. The sub-bank SB may have a predetermined height and may contain an organic insulating material such as polyimide (PI).

The plurality of light emitting elements ED may be arranged on the first insulating layer PAS1. The plurality of light emitting elements ED may be arranged in parallel to each other along the first direction (X-axis direction) and disposed between the first electrode RME1 and the second electrodes RME2. The length of the light emitting element ED in the first direction (X-axis direction) may be greater than the length between the first electrode RME1 and the second electrodes RME2. The light emitting element ED may include a plurality of semiconductor layers, and one end and the other end opposite to one end may be defined with respect to any one semiconductor layer. One end of the light emitting element ED may be disposed on the first electrode RME1, and the other end of the light emitting element ED may be disposed on the second electrode RME2. That is, the light emitting element ED may overlap one end of the first electrode RME1 and one end of the second electrode RME2 along the thickness direction (Z-axis direction). One end of the light emitting element ED may be electrically connected to the first electrode RME1 through the first contact electrode CTE1, and the other end of the light emitting element ED may be electrically connected to the second electrode RME2 through the second contact electrode CTE2.

The light emitting element ED may have a micro-meter or nano-meter size, and may be an inorganic light emitting diode including an inorganic material. The inorganic light emitting diode may be aligned between the first electrode RME1 and the second electrode RME2 facing each other by the electric field formed in a specific direction between the first electrode RME1 and the second electrode RME2.

For example, a plurality of light emitting elements ED may include active layers having the same material and emit light of the same wavelength band or light of the same color. The lights emitted from the first, second, and third emission areas LA1, LA2, and LA3 of the light emitting element layer EML may have the same color. For example, the plurality of light emitting elements ED may emit light of a third color or blue light having a peak wavelength in the range of about 440 nm to about 480 nm, but the present disclosure is not limited thereto.

The second insulating layer PAS2 may be disposed on the plurality of light emitting elements ED. For example, the second insulating layer PAS2 may partially cover each of the plurality of light emitting elements ED and may not cover both ends of each of the plurality of light emitting elements ED. The second insulating layer PAS2 may protect each of the plurality of light emitting elements ED, and may fix each of the plurality of light emitting elements ED in the manufacturing process of the display device 10. The second insulating layer PAS2 may fill the space between the light emitting element ED and the first insulating layer PAS1.

The first contact electrode CTE1 may be disposed on the first insulating layer PAS1, and may be connected to the first electrode RME1 while being inserted into the contact hole provided in the first insulating layer PAS1. For example, the contact hole of the first insulating layer PAS1 may be formed on the protruding pattern BP, but the present disclosure is not limited thereto. One end of the first contact electrode CTE1 may be connected to the first electrode RME1 on the protruding pattern BP, and the other end of the first contact electrode CTE1 may be connected to one end of the light emitting element ED.

The second contact electrode CTE2 may be disposed on the first insulating layer PAS1, and may be connected to the second electrode RME2 while being inserted into the contact hole provided in the first insulating layer PAS1. For example, the contact hole of the first insulating layer PAS1 may be disposed on the protruding pattern BP, but the present disclosure is not limited thereto. One end of the second contact electrode CTE2 may be connected to the other end of the light emitting element ED, and the other end of the second contact electrode CTE2 may be connected to the second electrode RME2 on the protruding pattern BP.

The third insulating layer PAS3 may be disposed on the first and second contact electrodes CTE1 and CTE2, the sub-bank SB, and the first and second insulating layers PAS1 and PAS2. The third insulating layer PAS3 may be disposed at the upper end of the light emitting element layer EML to protect the light emitting element layer EML.

The wavelength conversion layer WLCL may be disposed on the light emitting element layer EML. The wavelength conversion layer WLCL may include a first light blocking member BK1, a first wavelength conversion member WLC1, a second wavelength conversion member WLC2, a light transmission member LTU, a second passivation layer PV2, a second planarization layer OC2, or the like.

The first light blocking member BK1 may be disposed in the light blocking area BA on the third insulating layer PAS3. The first blocking member BK1 may overlap the sub-bank SB in the thickness direction. The first light blocking member BK1 may block transmission of light. The first light blocking member BK1 may prevent light infiltration and color mixture between the first, second, and third emission areas LA1, LA2, and LA3, which leads to the improvement of color reproducibility of the display device 10. The first light blocking member BK1 may be arranged in the form of a grid surrounding the first, second, and third emission areas LA1, LA2, and LA3 in a plan view.

The first wavelength conversion member WLC1 may be disposed in the first emission area LA1 on the third insulating layer PAS3. The first wavelength conversion member WLC1 may be surrounded by the first light blocking member BK1. The first wavelength conversion member WLC1 may include a first based resin BS1, a first scatterer SCT1, and a first wavelength shifter WLS1.

The first base resin BS1 may contain a material having a relatively high light transmittance. The first base resin BS1 may be formed of a transparent organic material. For example, the first base resin BS1 may contain at least one of organic materials such as epoxy resin, acrylic resin, cardo resin, or imide resin.

The first scatterer SCT1 may have a refractive index different from that of the first base resin BS1 and form an optical interface with the first base resin BS1. For example, the first scatterer SCT1 may contain a light scattering material or light scattering particles that scatter at least a part of the transmitted light. For example, the first scatterer SCT1 may contain a metallic oxide such as titanium oxide ($TiO_2$), zirconium oxide ($ZrO_2$), aluminum oxide ($AL_2O_3$), indium oxide ($In_2O_3$), zinc oxide (ZnO), or tin oxide ($SnO_2$), or may contain organic particles such as acrylic resin and urethane resin. The first scatterer SCT1 may scatter light in random directions regardless of the incidence direction of the incident light without any substantial change of the peak wavelength of the incident light.

The first wavelength shifter WLS1 may change or shift the peak wavelength of the incident light to a first peak wavelength. For example, the first wavelength shifter WLS1 may convert blue light provided from the display device 10 into red light having a single peak wavelength in the range of 610 nm to 650 nm and emit the red light. The first wavelength shifter WLS1 may be a quantum dot, a quantum rod, or a fluorescent substance. The quantum dot may be a particulate material that emits light of a specific color when an electron transitions from a conduction band to a valence band.

A part of the blue light emitted from the light emitting element layer EML may pass through the first wavelength conversion member WLC1 without being converted to red light by the first wavelength shifter WLS1. As a part of the blue light emitted from the light emitting element layer EML, the light incident on the first color filter CF1 without being converted by the first wavelength conversion member WLC1 may be blocked by the first color filter CF1. The red light produced by the first wavelength conversion member WLC1 converting the blue light emitted from the light emitting element layer EML may pass through the first color filter CF1 to be emitted to the outside. Accordingly, the red light may be emitted through the first emission area LA1.

The second wavelength conversion member WLC2 may be disposed in the second emission area LA2 on the third insulating layer PASS. The second wavelength conversion member WLC2 may be surrounded by the first light blocking member BK1. The second wavelength conversion member WLC2 may include a second base resin BS2, a second scatterer SCT2, and a second wavelength shifter WLS2.

The second base resin BS2 may contain a material having a relatively high light transmittance. The second base resin BS2 may be formed of a transparent organic material. For example, the second base resin BS2 may be made of the same material as the first base resin BS1, or may be made of the material exemplified in association with the first base resin BS1.

The second scatterer SCT2 may have a refractive index different from that of the second base resin BS2 and form an optical interface with the second base resin BS2. For example, the second scatterer SCT2 may contain a light scattering material or light scattering particles scattering at least a part of the transmitted light. For example, the second scatterer SCT2 may be made of the same material as the first scatterer SCT1, or may be made of the material exemplified in association with the first scatterer SCT1.

The second wavelength shifter WLS2 may change or shift the peak wavelength of the incident light to a second peak wavelength different from the first peak wavelength of the first wavelength shifter WLS1. For example, the second wavelength shifter WLS2 may convert blue light provided from the display device 10 into green light having a single peak wavelength in the range of about 510 nm to about 550 nm and emit the green light. The second wavelength shifter WLS2 may be a quantum dot, a quantum rod, or a fluorescent substance. The second wavelength shifter WLS2 may contain the materials identical in purpose with the materials exemplified in association with the first wavelength shifter WLS1. The second wavelength shifter WLS2 may be formed of a quantum dot, a quantum rod, or a fluorescent substance to have a wavelength conversion range different from that of the first wavelength shifter WLS1.

The light transmission member LTU may be disposed in the third emission area LA3 on the third insulating layer PAS3. The light transmission member LTU may be surrounded by the first light blocking member BK1. The light transmission member LTU may allow the incident light to pass therethrough while maintaining the peak wavelength of the light. The light transmission member LTU may include a third base resin BS3 and a third scatterer SCT3.

The third base resin BS3 may contain a material having a relatively high light transmittance. The third base resin BS3 may be formed of a transparent organic material. For example, the third base resin BS3 may be made of the same material as the first base resin BS1 or the second base resin BS2, or may be made of the material exemplified in association with the first base resin BS1 or the second base resin BS2.

The third scatterer SCT3 may have a refractive index different from that of the third base resin BS3 and form an optical interface with the third base resin BS3. For example, the third scatterer SCT3 may contain a light scattering material or light scattering particles scattering at least a part of the transmitted light. For example, the third scatterer SCT3 may be formed of the same material as the first scatterer SCT1 or the second scatterer SCT2, or may be made of the material exemplified in association with the first scatterer SCT1 or the second scatterer SCT2.

Since the wavelength conversion layer WLCL is disposed directly on the third insulating layer PAS3 of the light emitting element layer EML, the display device 10 may not require a separate substrate for the first and second wavelength conversion members WLC1 and WLC2 and the light transmission member LTU. Accordingly, the first and second wavelength conversion members WLC1 and WLC2 and the light transmission member LTU may be easily aligned in the first, second, and third emission areas LA1, LA2, and LA3, respectively, and the thickness of the display device 10 may be relatively reduced.

The second passivation layer PV2 may cover the first and second wavelength conversion members WLC1 and WLC2, the light transmission member LTU, and the first light blocking member BK1. For example, the second passivation layer PV2 may seal the first and second wavelength conversion members WLC1 and WLC2 and the light transmission member LTU to prevent the first and second wavelength conversion members WLC1 and WLC2 and the light transmission member LTU from damage or contamination. For example, the second passivation layer PV2 may contain an inorganic material.

The second planarization layer OC2 may be disposed on the second passivation layer PV2 to flatten the upper ends of the first and second wavelength conversion members WLC1 and WLC2 and the light transmission member LTU. For example, the second planarization layer OC2 may contain an organic insulating material such as polyimide (PI).

The color filter layer CFL may be disposed on the wavelength conversion layer WLCL. The color filter layer CFL may include a second light blocking member BK2, first, second, and third color filters CF1, CF2, and CF3, and a third passivation layer PV3.

The second light blocking member BK2 may be disposed in the light blocking area BA on the second planarization layer OC2 of the wavelength conversion layer WLCL. The second blocking member BK2 may overlap the first blocking member BK1 or the sub-bank SB in the thickness direction. The second light blocking member BK2 may block transmission of light. The second light blocking member BK2 may prevent light infiltration and color mixture between the first, second, and third emission areas LA1, LA2, and LA3, which leads to the improvement of color reproducibility of the display device 10. The second light blocking member BK2 may be arranged in the form of a grid surrounding the first, second, and third emission areas LA1, LA2, and LA3 in a plan view.

The first color filter CF1 may be disposed in the first emission area LA1 on the second planarization layer OC2. The first color filter CF1 may be surrounded by the second light blocking member BK2. The first color filter CF1 may overlap the first wavelength conversion member WLC1 in the thickness direction. The first color filter CF1 may selectively allow the first color light (e.g., red light) to pass therethrough, and block or absorb the second color light (e.g., green light) and the third color light (e.g., blue light). For example, the first color filter CF1 may be a red color filter and contain a red colorant.

The second color filter CF2 may be disposed in the second emission area LA2 on the second planarization layer OC2. The second color filter CF2 may be surrounded by the second light blocking member BK2. The second color filter CF2 may overlap the second wavelength conversion member WLC2 in the thickness direction. The second color filter CF2 may selectively allow the second color light (e.g., green light) to pass therethrough, and block or absorb the first color light (e.g., red light) and the third color light (e.g., blue light). For example, the second color filter CF2 may be a green color filter and contain a green colorant.

The third color filter CF3 may be disposed in the third emission area LA3 on the second planarization layer OC2. The third color filter CF3 may be surrounded by the second light blocking member BK2. The third color filter CF3 may overlap the light transmission member LTU in the thickness direction. The third color filter CF3 may selectively allow the third color light (e.g., blue light) to pass therethrough, and block or absorb the first color light (e.g., red light) and the second color light (e.g., green light). For example, the third color filter CF3 may be a blue color filter and contain a blue colorant.

The first, second, and third color filters CF1, CF2, and CF3 may absorb a part of the light coming from the outside of the display device 10 to reduce the reflected light of the external light. Thus, the first, second, and third color filters CF1, CF2, and CF3 can prevent color distortion caused by the reflection of the external light.

Since the first, second, and third color filters CF1, CF2, and CF3 are directly disposed on the second planarization layer OC2 of the wavelength conversion layer WLCL, the display device 10 may not require a separate substrate for the first, second, and third color filters CF1, CF2, and CF3. Therefore, the thickness of the display device 10 may be relatively reduced.

The third passivation layer PV3 may cover the first, second, and third color filters CF1, CF2, and CF3. The third passivation layer PV3 may protect the first, second, and third color filters CF1, CF2, and CF3.

The encapsulation layer TFE may be disposed on the third passivation layer PV3 of the color filter layer CFL. The encapsulation layer TFE may cover the top and side surfaces of the display layer DPL. For example, the encapsulation layer TFE may include at least one inorganic layer to prevent permeation of oxygen or moisture. In addition, the encapsulation layer TFE may include at least one organic layer to protect the display device 10 from foreign substances such as dust.

The second pad part PD2 may be disposed on the bottom surface of the first substrate SUB1. The second pad part PD2 may be inserted into the first contact hole CNT1 and connected to the first pad part PD1. The second pad part PD2 may receive various voltages or signals from the flexible film FPCB, and supply the corresponding voltages or signals to the first pad part PD1, the first connection line CWL1, and the second connection line CWL2.

The connection film ACF may attach the flexible film FPCB to the bottom surface of the second pad part PD2. One surface of the connection film ACF may be attached to the second pad part PD2, and the other surface of the connection film ACF may be attached to the flexible film FPCB. For example, the connection film ACF may include an anisotropic conductive film. When the connection film ACF includes an anisotropic conductive film, the connection film ACF may have conductivity in a region where the second pad part PD2 and a contact pad of the flexible film FPCB are in contact with each other, and may electrically connect the flexible film FPCB to the second pad part PD2.

The flexible film FPCB may be disposed on the bottom surface of the first substrate SUB1. One side of the flexible film FPCB may be connected to the second pad part PD2, and the other side of the flexible film FPCB may be connected to a source circuit board (not shown) on the bottom surface of the first substrate SUB1. The flexible film FPCB may transmit the signal of the data driver DIC to the display device 10. For example, the data driver DIC may be an integrated circuit (IC). The data driver DIC may convert digital video data to an analog data voltage based on a data control signal of a timing controller, and supply the analog data voltage to the data line of the display area DA through the flexible film FPCB. Since the display device 10 includes the first pad part PD1 disposed on the barrier layer BR, the second pad part PD2 disposed on the bottom surface of the first substrate SUB1, and the flexible film FPCB connected to the second pad part PD2, it is possible to minimize the non-display area NDA in size.

FIGS. 5, 6, 7, 8, 9, 10, and 11 are cross-sectional views illustrating a manufacturing process of a display device according to one embodiment.

Figure 5:
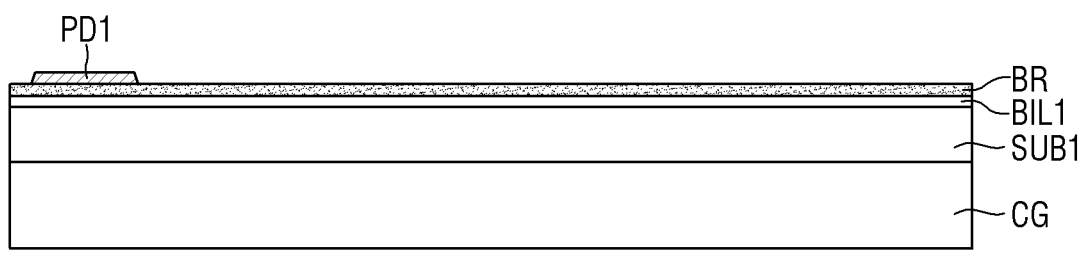
FIGS. 5, 6, 7, 8, 9, 10, and 11 are cross-sectional views illustrating a manufacturing process of a display device according to one embodiment.

In FIG. 5, a carrier substrate CG may support the display device 10 in the manufacturing process of the display device 10. For example, the carrier substrate CG may be a carrier glass, but the present disclosure is not limited thereto.

The first substrate SUB1 may be disposed on the carrier substrate CG. The first substrate SUB1 may be a base substrate or a base member. For example, the first substrate SUB1 may include an insulating material such as a polymer resin such as polyimide (PI), but the present disclosure is not limited thereto.

The first barrier insulating layer BIL1 may be disposed on the first substrate SUB1. The first barrier insulating layer BIL1 may include an inorganic layer capable of preventing permeation of air or moisture. For example, the first barrier insulating layer BIL1 may include at least one of a silicon nitride layer, a silicon oxynitride layer, a silicon oxide layer, a titanium oxide layer, or an aluminum oxide layer, but the present disclosure is not limited thereto.

The barrier layer BR may be disposed on the first barrier insulating layer BIL1. The barrier layer BR may contain amorphous carbon. The barrier layer BR may be deposited on the first barrier insulating layer BIL1 using plasma enhanced chemical vapor deposition (PECVD), but the present disclosure is not limited thereto. For example, the barrier layer BR may be deposited after the deposition of the first barrier insulating layer BIL1 is completed. In another example, the barrier layer BR and the first barrier insulating layer BIL1 may be deposited simultaneously in the same process.

The first pad part PD1 may be disposed on one surface or the top surface of the barrier layer BR.

Figure 6:
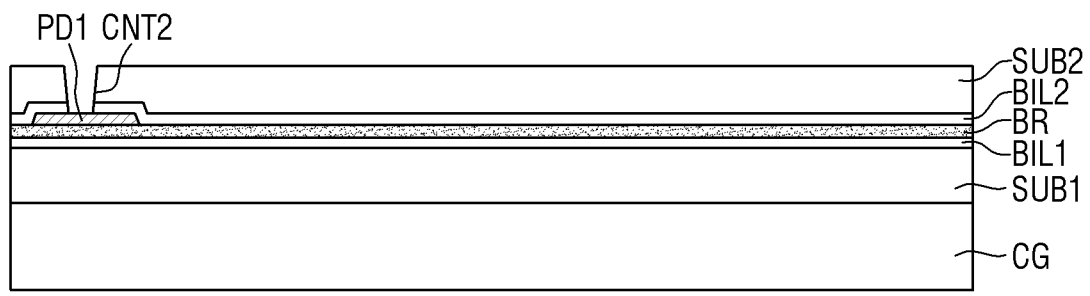

In FIG. 6, the second barrier insulating layer BIL2 may be disposed on the barrier layer BR and the first pad part PD1. The second barrier insulating layer BIL2 may include an inorganic layer capable of preventing permeation of air or moisture. For example, the second barrier insulating layer BIL2 may include at least one of a silicon nitride layer, a silicon oxynitride layer, a silicon oxide layer, a titanium oxide layer, or an aluminum oxide layer, but the present disclosure is not limited thereto.

The second substrate SUB2 may be disposed on the second barrier insulating layer BIL2. The second substrate SUB2 may be a base substrate or a base member. For example, the second substrate SUB2 may include an insulating material such as a polymer resin such as polyimide (PI), but the present disclosure is not limited thereto.

The second contact hole CNT2 may be defined in the second barrier insulating layer BIL2 and the second substrate SUB2. The second contact hole CNT2 may be etched from the top surface of the second substrate SUB2 to penetrate the bottom surface of the second barrier insulating layer BIL2. For example, the upper width of the second contact hole CNT2 may be greater than the lower width of the second contact hole CNT2. That is, the second contact hole CNT2 may have a tapered shape.

Figure 7:
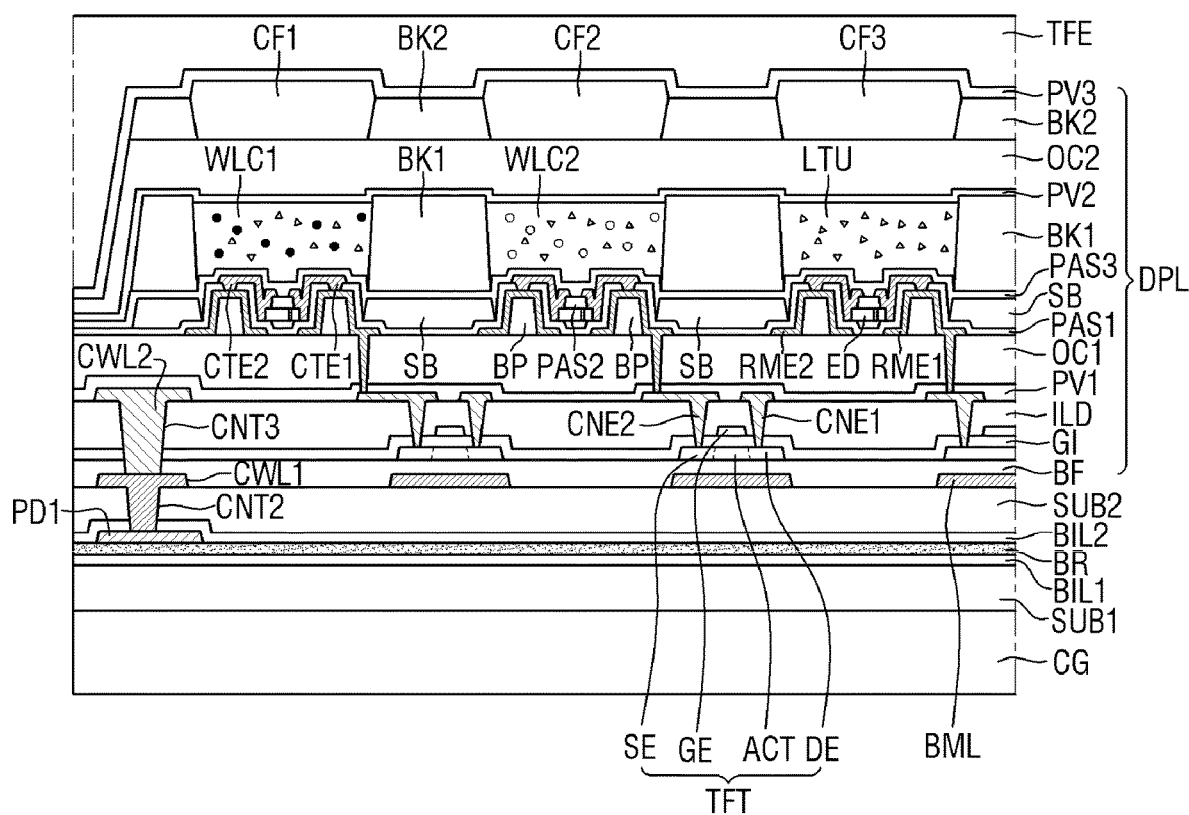

In FIG. 7, the display layer DPL may be stacked on the second substrate SUB2. The thin film transistor layer TFTL, the light emitting element layer EML, the wavelength conversion layer WLCL, and the color filter layer CFL may be sequentially stacked on the second substrate SUB2. The encapsulation layer TFE may cover the top and side surfaces of the display layer DPL.

Figure 8:
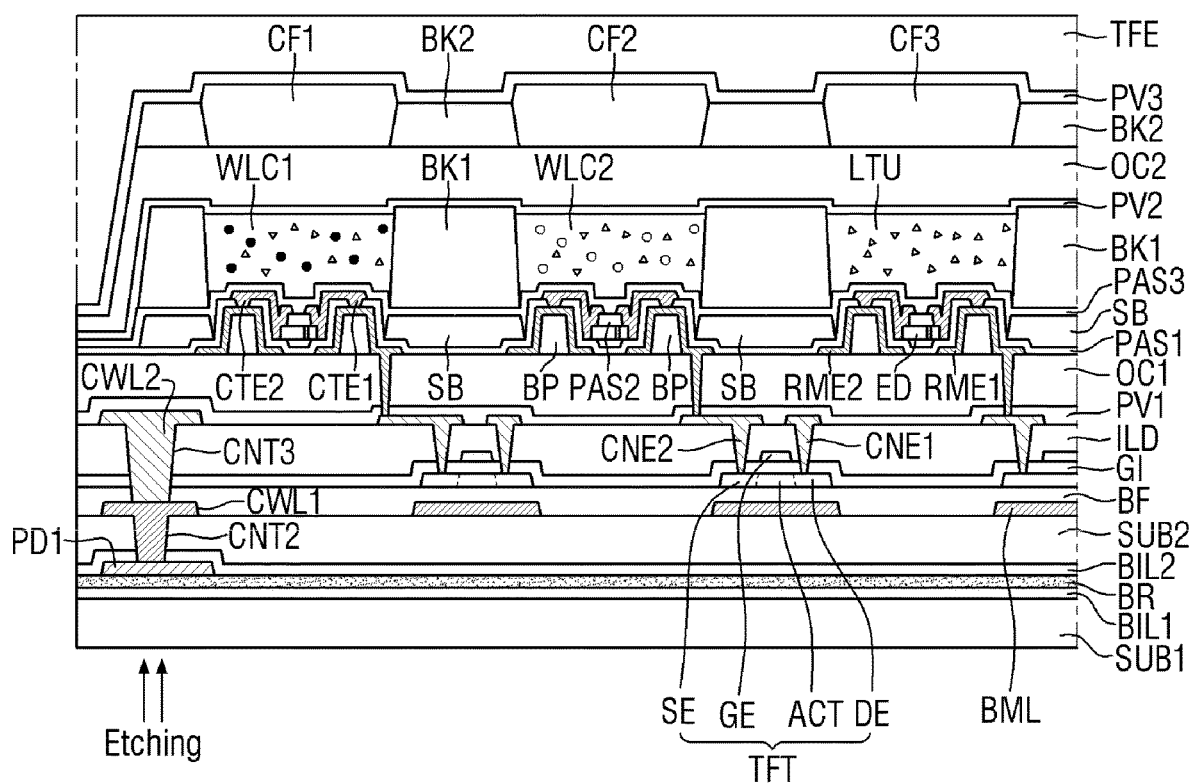

In FIG. 8, the carrier substrate CG may be removed from the bottom surface of the first substrate SUB1. For example, the carrier substrate CG may be removed from the bottom surface of the first substrate SUB1 using a sacrificial layer (not shown) disposed between the carrier substrate CG and the first substrate SUB1, but the present disclosure is not limited thereto.

The bottom surface of the first substrate SUB1 may be subjected to at least one of a dry etching process, a plasma etching process, or a laser etching process. For example, the bottom surface of the first substrate SUB1 may be patterned by a dry etching process using oxygen gas ($O_2$ gas).

The bottom surface of the first barrier insulating layer BIL1 may be subjected to at least one of a dry etching process, a plasma etching process, or a laser etching process. For example, the bottom surface of the first barrier insulating layer BIL1 may be patterned by a dry etching process using fluorine-based gas (F-gas).

The barrier layer BR may have a high etching selectivity with respect to the fluorine-based gas (F-gas). For example, with respect to the fluorine-based gas (F-gas), the etching rate of the first barrier insulating layer BIL1 may be set to be considerably higher than the etching rate of the barrier layer BR. Therefore, the barrier layer BR may protect the bottom surface of the first pad part PD1 in the etching process of the first barrier insulating layer BIL1 using the fluorine-based gas (F-gas) to prevent damage to the first pad part PD1 and prevent particles from being generated on the bottom surface of the first pad part PD1.

Figure 9:
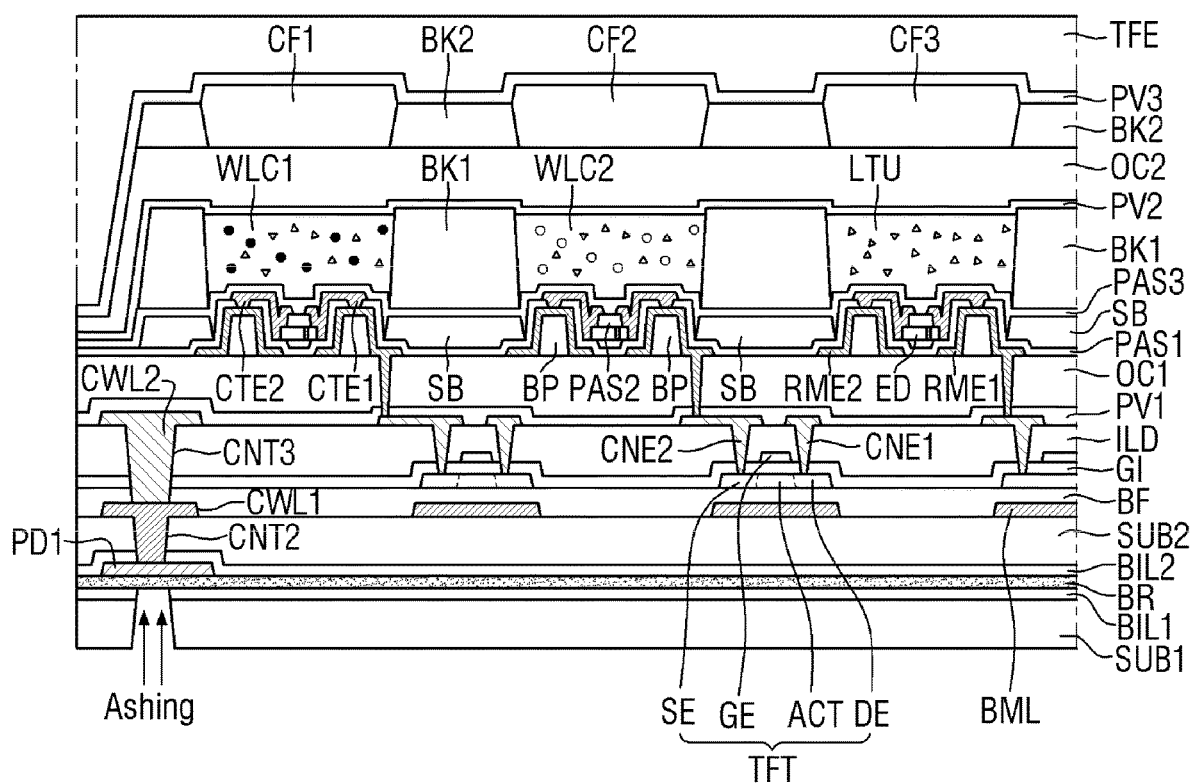
Figure 10:
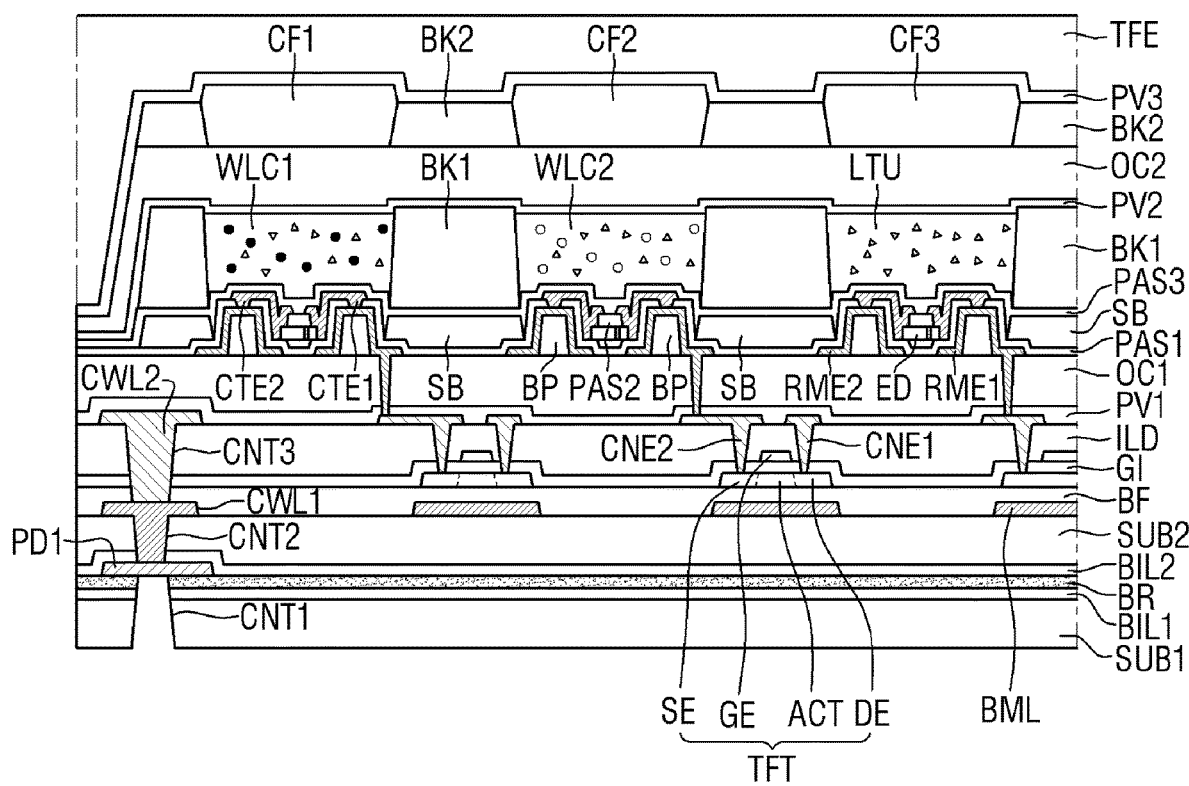

In FIGS. 9 and 10, the bottom surface of the barrier layer BR may be subjected to at least one of a dry etching process, a plasma etching process, or a laser etching process. For example, the barrier layer BR may be patterned by an ashing process using oxygen gas ($O_2$ gas). Therefore, the first contact hole CNT1 may be formed by sequential patterning of the first substrate SUB1, the first barrier insulating layer BIL1 and the barrier layer BR. A part of the bottom surface of the first pad part PD1 may be exposed through the first contact hole CNT1.

When the first pad part PD1 is directly disposed on the first substrate SUB1, the interface having weak adhesive strength is formed between the first pad part PD1 and the first substrate SUB1 and, thus, the film lifting phenomenon of the first pad part PD1 may occur in the manufacturing process of the display device 10. Since the display device 10 includes the first pad part PD1 disposed on the barrier layer BR, it is possible to prevent the film lifting phenomenon of the first pad part PD1 during the manufacturing process of the display device 10.

Figure 11:
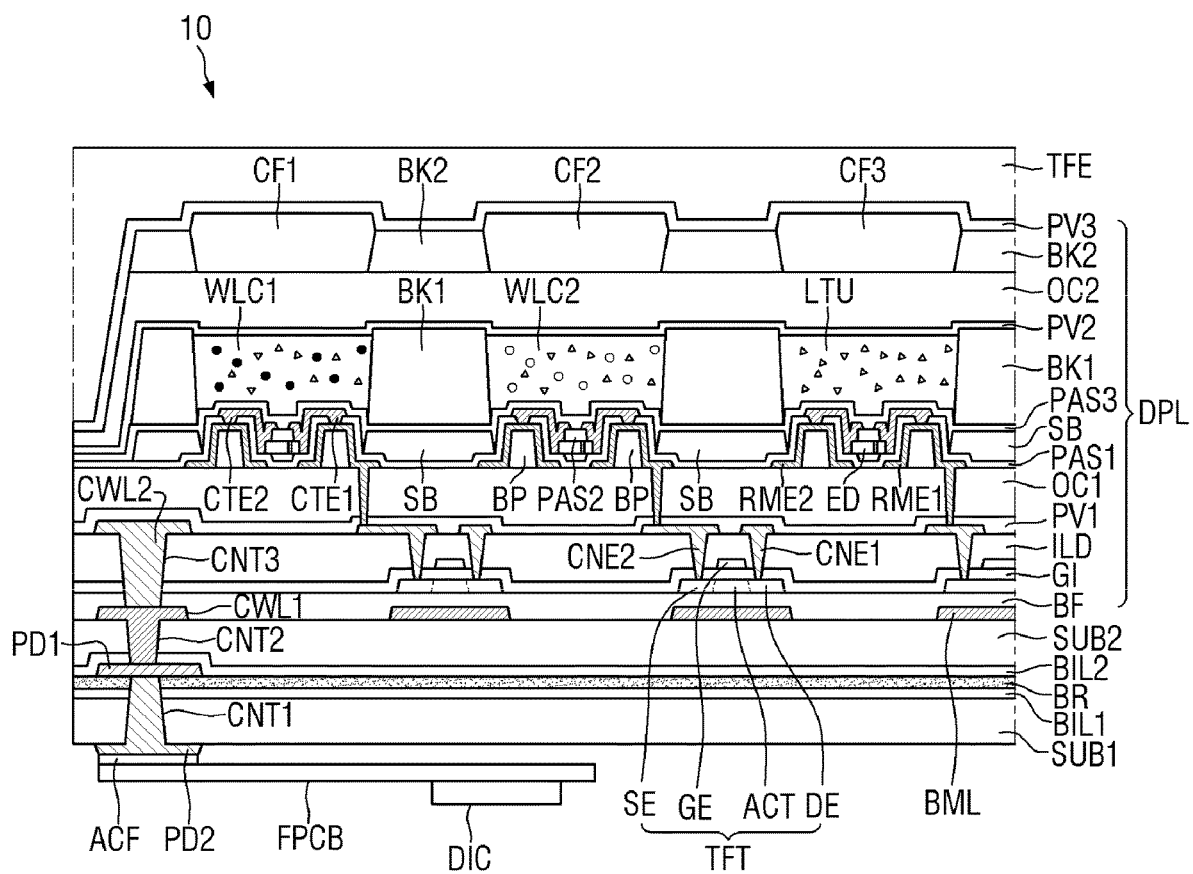

In FIG. 11, the second pad part PD2 may be disposed on the bottom surface of the first substrate SUB1. The second pad part PD2 may be inserted into the first contact hole CNT1 and connected to the first pad part PD1. The second pad part PD2 may receive various voltages or signals from the flexible film FPCB, and supply the corresponding voltages or signals to the first pad part PD1, the first connection line CWL1, and the second connection line CWL2.

The flexible film FPCB may be disposed on the bottom surface of the first substrate SUB1. One side of the flexible film FPCB may be connected to the second pad part PD2, and the other side of the flexible film FPCB may be connected to the source circuit board (not shown) on the bottom surface of the first substrate SUB1. The flexible film FPCB may transmit the signal of the data driver DIC to the display device 10. Since the display device 10 includes the first pad part PD1 disposed on the barrier layer BR, the second pad part PD2 disposed on the bottom surface of the first substrate SUB1, and the flexible film FPCB connected to the second pad part PD2, it is possible to minimize the non-display area NDA in size.

Figure 12:
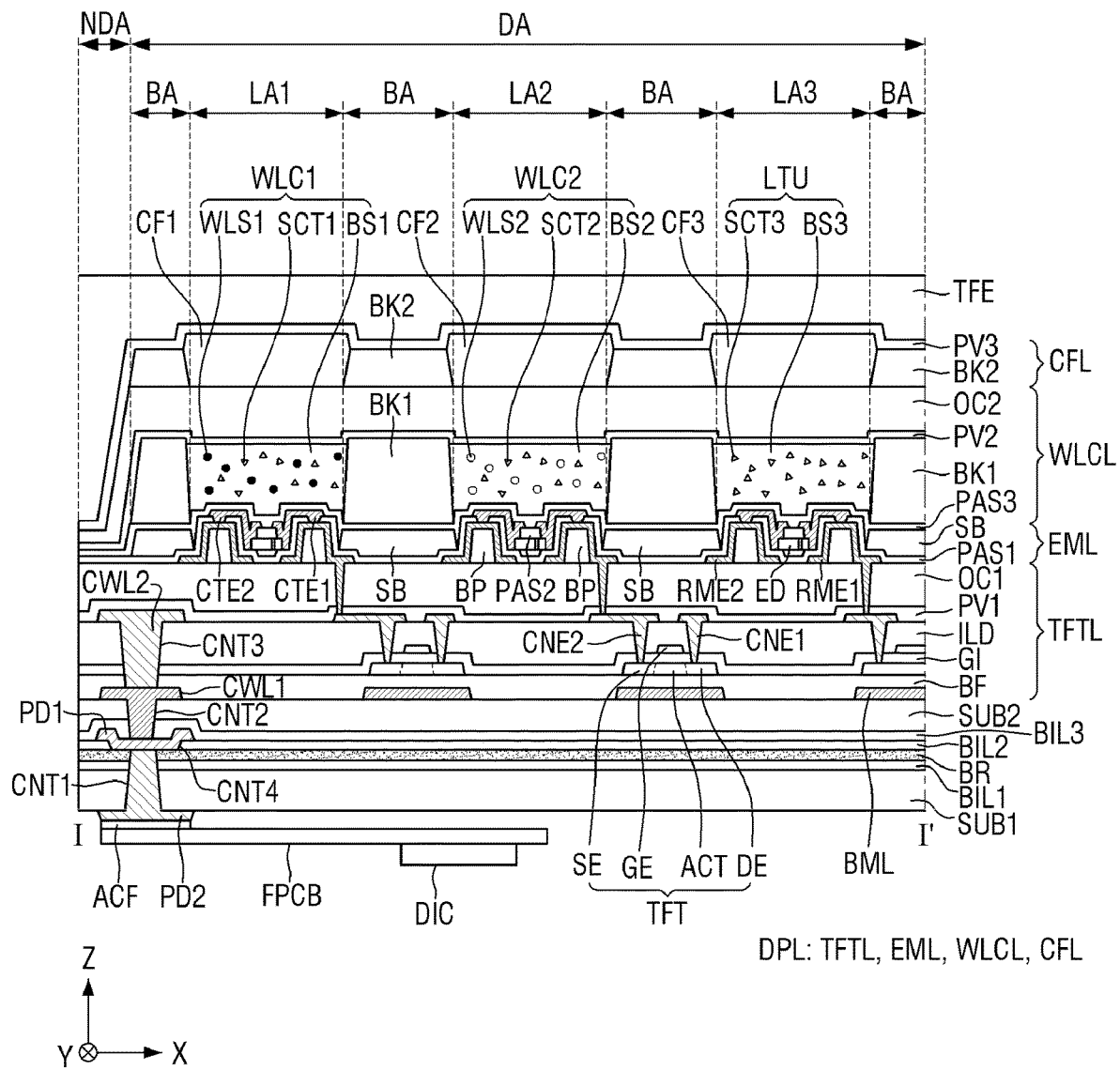
FIG. 12 is a cross-sectional view of another example taken along line I-I' of FIG. 2.

FIG. 12 is a cross-sectional view of another example taken along line I-I' of FIG. 2. The display device of FIG. 12 is different from the display device of FIG. 3 in that it further includes a third barrier insulating layer BIL3, so that the same configuration as the above-described configuration will be briefly described, or a description thereof will be omitted.

Referring to FIG. 12, the display device 10 may include the first substrate SUB1, the first barrier insulating layer BIL1 the barrier layer BR, the second barrier insulating layer BIL2, the first pad part PD1, the third barrier insulating layer BIL3, the second substrate SUB2, the display layer DPL, the encapsulation layer TFE, the second pad part PD2, the connection film ACF, the flexible film FPCB, and the data driver DIC.

The first substrate SUB1 may support the display device 10. The first substrate SUB1 may be a base substrate or a base member. For example, the first substrate SUB1 may include an insulating material such as a polymer resin such as polyimide (PI), but the present disclosure is not limited thereto.

The first barrier insulating layer BIL1 may be disposed on the first substrate SUB1. The first barrier insulating layer BIL1 may include an inorganic layer capable of preventing permeation of air or moisture. For example, the first barrier insulating layer BIL1 may include at least one of a silicon nitride layer, a silicon oxynitride layer, a silicon oxide layer, a titanium oxide layer, or an aluminum oxide layer, but the present disclosure is not limited thereto.

The barrier layer BR may be disposed on the first barrier insulating layer BIL1 The barrier layer BR may be deposited on the first barrier insulating layer BIL1 using plasma enhanced chemical vapor deposition (PECVD), but the present disclosure is not limited thereto. The barrier layer BR may protect the bottom surface of the first pad part PD1 in the process of forming the first contact hole CNT1. The barrier layer BR may contain amorphous carbon. The barrier layer BR may be patterned by an ashing process using oxygen gas ($O_2$ gas). The barrier layer BR may have a high etching selectivity with respect to the fluorine-based gas (F-gas). For example, with respect to the fluorine-based gas (F-gas), the etching rate of the first barrier insulating layer BIL1 may be considerably higher than the etching rate of the barrier layer BR. The etching rate of the barrier layer BR with respect to oxygen gas ($O_2$ gas) may be considerably higher than the etching rate of the barrier layer BR with respect to fluorine-based gas (F-gas). Therefore, the barrier layer BR may protect the bottom surface of the first pad part PD1 in the etching process of the first barrier insulating layer BIL1 using the fluorine-based gas (F-gas) to prevent damage to the first pad part PD1 and prevent particles from being generated on the bottom surface of the first pad part PD1.

When the first pad part PD1 is directly disposed on the first substrate SUB1, the interface having weak adhesive strength is formed between the first pad part PD1 and the first substrate SUB1 and, thus, the film lifting phenomenon of the first pad part PD1 may occur in the manufacturing process of the display device 10. Since the display device 10 includes the second barrier insulating layer BIL2 and the first pad part PD1 disposed on the barrier layer BR, it is possible to prevent the film lifting phenomenon of the first pad part PD1 in the manufacturing process of the display device 10.

The first contact hole CNT 1 may be defined in the first substrate SUB1, the first barrier insulating layer BILL and the barrier layer BR. The first contact hole CNT1 may be patterned from the bottom surface of the first substrate SUB1 to penetrate the top surface of the barrier layer BR. For example, the lower width of the first contact hole CNT1 may be greater than the upper width of the first contact hole CNT1. That is, the first contact hole CNT1 may have a tapered shape.

The second barrier insulating layer BIL2 may be disposed on the barrier layer BR. The second barrier insulating layer BIL2 may include an inorganic layer capable of preventing permeation of air or moisture. For example, the second barrier insulating layer BIL2 may include at least one of a silicon nitride layer, a silicon oxynitride layer, a silicon oxide layer, a titanium oxide layer, or an aluminum oxide layer, but the present disclosure is not limited thereto.

The first pad part PD1 may be disposed on the second barrier insulating layer BIL2. The first pad part PD1 may be in direct contact with the barrier layer BR while being inserted into a fourth contact hole CNT4 provided in the second barrier insulating layer BIL2. The fourth contact hole CNT4 may overlap the first contact hole CNT1 in the thickness direction (Z-axis direction). The first pad part PD1 may be connected to the first connection line CWL1 inserted into the second contact hole CNT2. The first pad part PD1 may be electrically connected to the flexible film FPCB through the second pad part PD2 inserted into the first contact hole CNT1. The first pad part PD1 may supply the electrical signal received from the flexible film FPCB to the first connection line CWL1.

The third barrier insulating layer BIL3 may be disposed on the second barrier insulating layer BIL2 and the barrier layer BR. The third barrier insulating layer BIL3 may include an inorganic layer capable of preventing permeation of air or moisture. For example, the third barrier insulating layer BIL3 may include at least one of a silicon nitride layer, a silicon oxynitride layer, a silicon oxide layer, a titanium oxide layer, or an aluminum oxide layer, but the present disclosure is not limited thereto. Since the display device 10 of FIG. 12 further includes the third barrier insulating layer BIL3 compared to the display device of FIG. 3, it is possible to improve the barrier function of the display device 10.

The second substrate SUB2 may be disposed on the third barrier insulating layer BIL3. The second substrate SUB2 may be a base substrate or a base member. For example, the second substrate SUB2 may include an insulating material such as a polymer resin such as polyimide (PI), but the present disclosure is not limited thereto.

The second contact hole CNT2 may be defined in the third barrier insulating layer BIL3 and the second substrate SUB2. The second contact hole CNT2 may be etched from the top surface of the second substrate SUB2 to penetrate the bottom surface of the third barrier insulating layer BIL3. For example, the upper width of the second contact hole CNT2 may be greater than the lower width of the second contact hole CNT2. That is, the second contact hole CNT2 may have a tapered shape along the thickness direction (Z-axis direction). The second contact hole CNT2 may overlap the first contact hole CNT1 in the thickness direction (Z-axis direction), but the present disclosure is not limited thereto.

The display layer DPL may be disposed on the second substrate SUB2. The thin film transistor layer TFTL, the light emitting element layer EML, the wavelength conversion layer WLCL, and the color filter layer CFL may be sequentially stacked on the second substrate SUB2. The encapsulation layer TFE may cover the top and side surfaces of the display layer DPL.

The second pad part PD2 may be disposed on the bottom surface of the first substrate SUB1. The second pad part PD2 may be inserted into the first contact hole CNT1 and connected to the first pad part PD1. The second pad part PD2 may receive various voltages or signals from the flexible film FPCB, and supply the corresponding voltages or signals to the first pad part PD1, the first connection line CWL1, and the second connection line CWL2.

The connection film ACF may attach the flexible film FPCB to the bottom surface of the second pad part PD2. One surface of the connection film ACF may be attached to the second pad part PD2, and the other surface of the connection film ACF may be attached to the flexible film FPCB. For example, the connection film ACF may include an anisotropic conductive film. The connection film ACF may electrically connect the flexible film FPCB to the second pad part PD2.

The flexible film FPCB may be disposed on the bottom surface of the first substrate SUB1. One side of the flexible film FPCB may be connected to the second pad part PD2, and the other side of the flexible film FPCB may be connected to a source circuit board (not shown) on the bottom surface of the first substrate SUB1. The flexible film FPCB may transmit the signal of the data driver DIC to the display device 10. For example, the data driver DIC may be an integrated circuit (IC). The data driver DIC may convert digital video data to an analog data voltage based on the data control signal of the timing controller, and supply the analog data voltage to the data line of the display area DA through the flexible film FPCB. Since the display device 10 includes the first pad part PD1 disposed on the second barrier insulating layer BIL2, the second pad part PD2 disposed on the bottom surface of the first substrate SUB1, and the flexible film FPCB connected to the second pad part PD2, it is possible to minimize the non-display area NDA in size.

FIGS. 13, 14, 15, 16, 17, 18, and 19 are cross-sectional views illustrating a manufacturing process of a display device according to another embodiment. Hereinafter, the same configurations as the above-described configurations will be briefly described, or a description thereof will be omitted.

Figure 13:
FIGS. 13, 14, 15, 16, 17, 18, and 19 are cross-sectional views illustrating a manufacturing process of a display device according to another embodiment.

In FIG. 13, the carrier substrate CG may support the display device 10 in the manufacturing process of the display device 10. For example, the carrier substrate CG may be a carrier glass, but the present disclosure is not limited thereto.

The first substrate SUB1 may be disposed on the carrier substrate CG. The first substrate SUB1 may be a base substrate or a base member. For example, the first substrate SUB1 may include an insulating material such as a polymer resin such as polyimide (PI), but the present disclosure is not limited thereto.

The first barrier insulating layer BIL1 may be disposed on the first substrate SUB1. The first barrier insulating layer BIL1 may include an inorganic layer capable of preventing permeation of air or moisture.

The barrier layer BR may be disposed on the first barrier insulating layer BIL1. The barrier layer BR may contain amorphous carbon. The barrier layer BR may be deposited on the first barrier insulating layer BIL1 using plasma enhanced chemical vapor deposition (PECVD), but the present disclosure is not limited thereto. For example, the barrier layer BR may be deposited after the deposition of first barrier insulating layer BIL1 is completed. In another example, the barrier layer BR and the first barrier insulating layer BIL1 may be deposited simultaneously in the same process.

The second barrier insulating layer BIL2 may be disposed on the barrier layer BR. The second barrier insulating layer BIL2 may include an inorganic layer capable of preventing permeation of air or moisture.

The first pad part PD1 may be disposed on one surface or the top surface of the second barrier insulating layer BIL2. The first pad part PD1 may be in contact with a part of the barrier layer BR while being inserted into the fourth contact hole CNT4 provided in the second barrier insulating layer BIL2. The fourth contact hole CNT4 may be formed at a position where the first contact hole CNT1 is formed.

Figure 14:
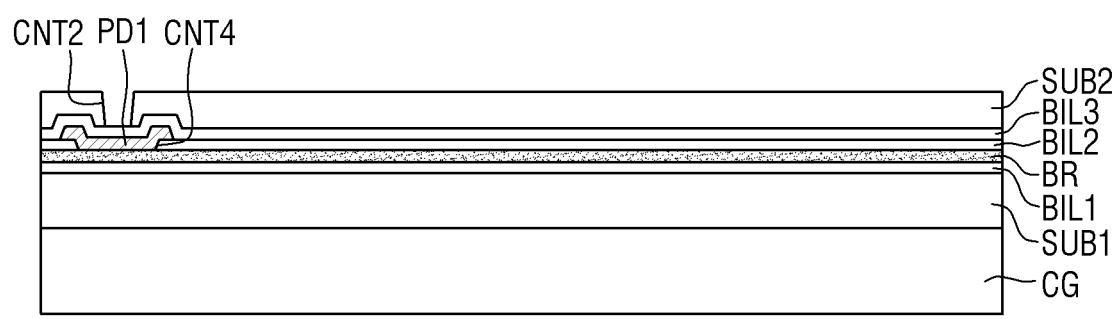

In FIG. 14, the third barrier insulating layer BIL3 may be disposed on the second barrier insulating layer BIL2 and the first pad part PD1. The third barrier insulating layer BIL3 may include an inorganic layer capable of preventing permeation of air or moisture.

The second substrate SUB2 may be disposed on the third barrier insulating layer BIL3. The second substrate SUB2 may be a base substrate or a base member. For example, the second substrate SUB2 may include an insulating material such as a polymer resin such as polyimide (PI), but the present disclosure is not limited thereto.

The second contact hole CNT2 may be defined in the third barrier insulating layer BIL3 and the second substrate SUB2. The second contact hole CNT2 is etched from the top surface of the second substrate SUB2 to penetrate the bottom surface of third barrier insulating layer BIL3. For example, the upper width of the second contact hole CNT2 may be greater than the lower width of the second contact hole CNT2. That is, the second contact hole CNT2 may have a tapered shape.

Figure 15:
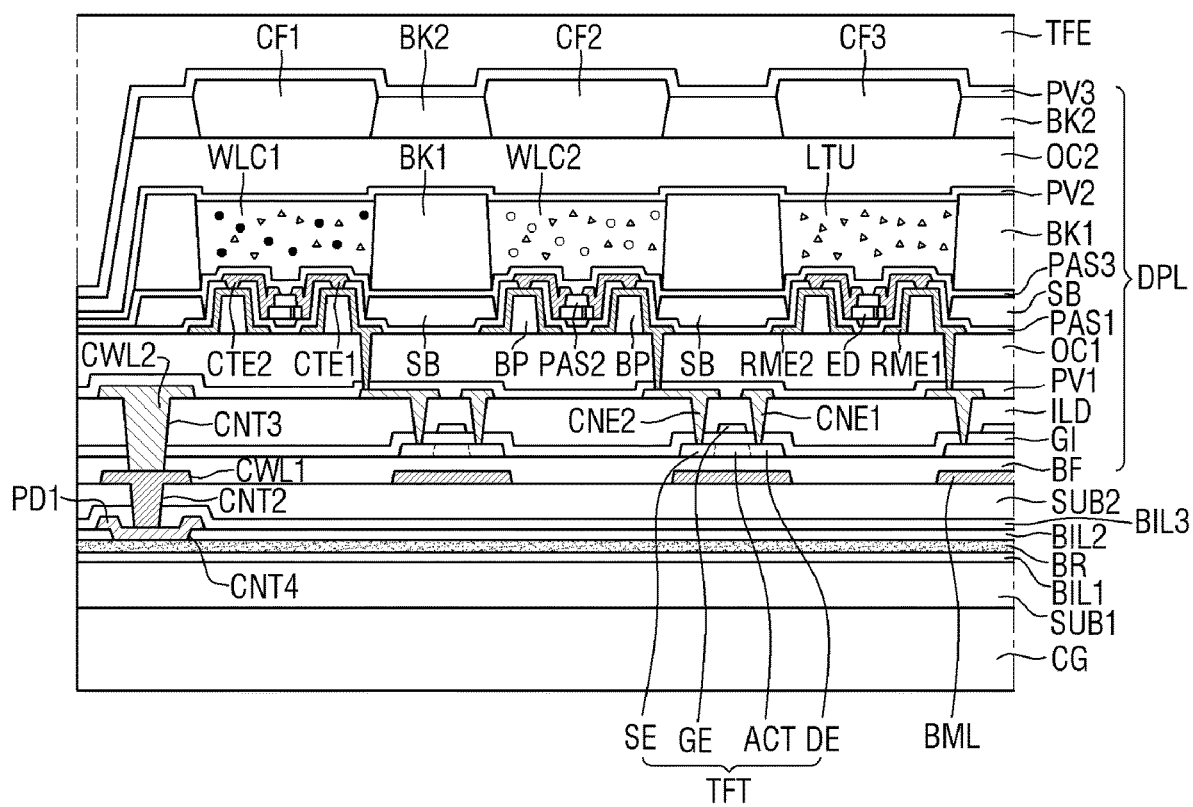

In FIG. 15, the display layer DPL may be stacked on the second substrate SUB2. The thin film transistor layer TFTL, the light emitting element layer EML, the wavelength conversion layer WLCL, and the color filter layer CFL may be sequentially stacked on the second substrate SUB2. The encapsulation layer TFE may cover the top and side surfaces of the display layer DPL.

Figure 16:
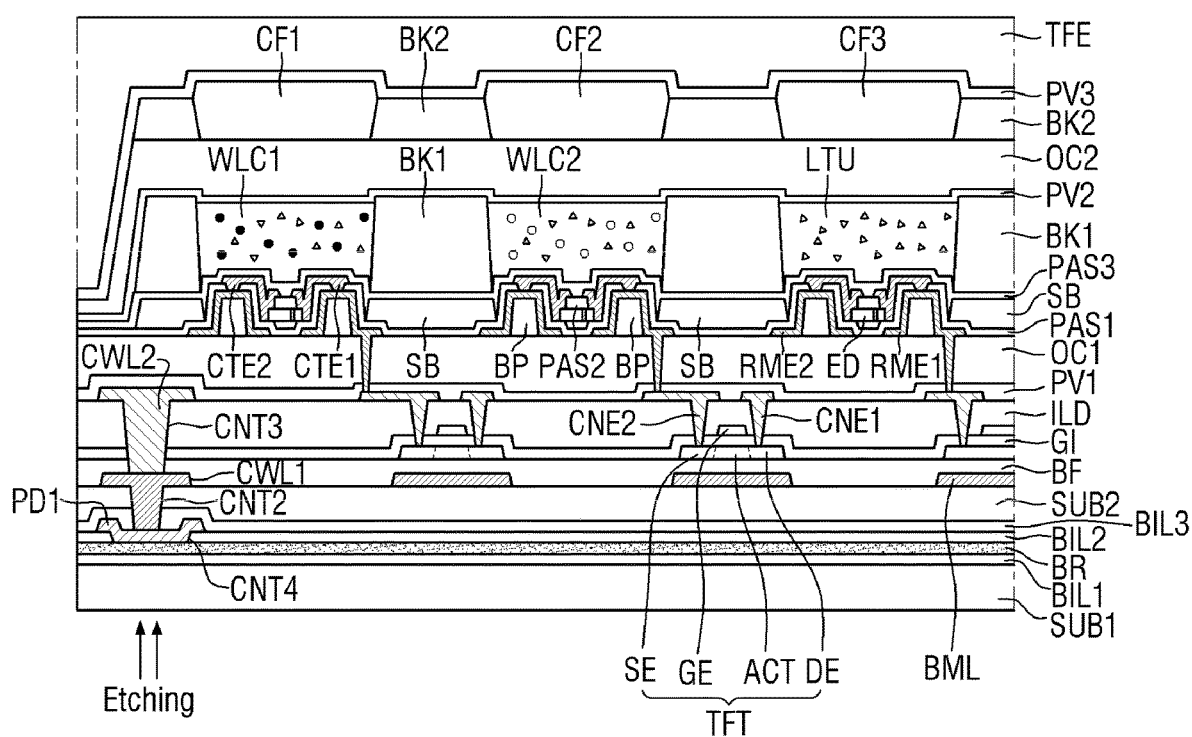

In FIG. 16, the carrier substrate CG may be removed from the bottom surface of the first substrate SUB1. For example, the carrier substrate CG may be removed from the bottom surface of the first substrate SUB1 using the sacrificial layer (not shown) disposed between the carrier substrate CG and the first substrate SUB1, but the present disclosure is not limited thereto.

The bottom surface of the first substrate SUB1 may be subjected to at least one of a dry etching process, a plasma etching process, or a laser etching process. For example, the bottom surface of the first substrate SUB1 may be patterned by a dry etching process using oxygen gas (O2 gas).

The bottom surface of the first barrier insulating layer BIL1 may be subjected to at least one of a dry etching process, a plasma etching process, or a laser etching process.

For example, the bottom surface of the first barrier insulating layer BIL1 may be patterned by a dry etching process using fluorine-based gas (F-gas).

The barrier layer BR may have a high etching selectivity with respect to the fluorine-based gas (F-gas). For example, with respect to the fluorine-based gas (F-gas), the etching rate of the first barrier insulating layer BIL1 may be set to be considerably higher than the etching rate of the barrier layer BR. Therefore, the barrier layer BR may protect the bottom surface of the first pad part PD1 in the etching process of the first barrier insulating layer BIL1 using the fluorine-based gas (F-gas) to prevent damage to the first pad part PD1 and prevent particles from being generated on the bottom surface of the first pad part PD1.

Figure 17:
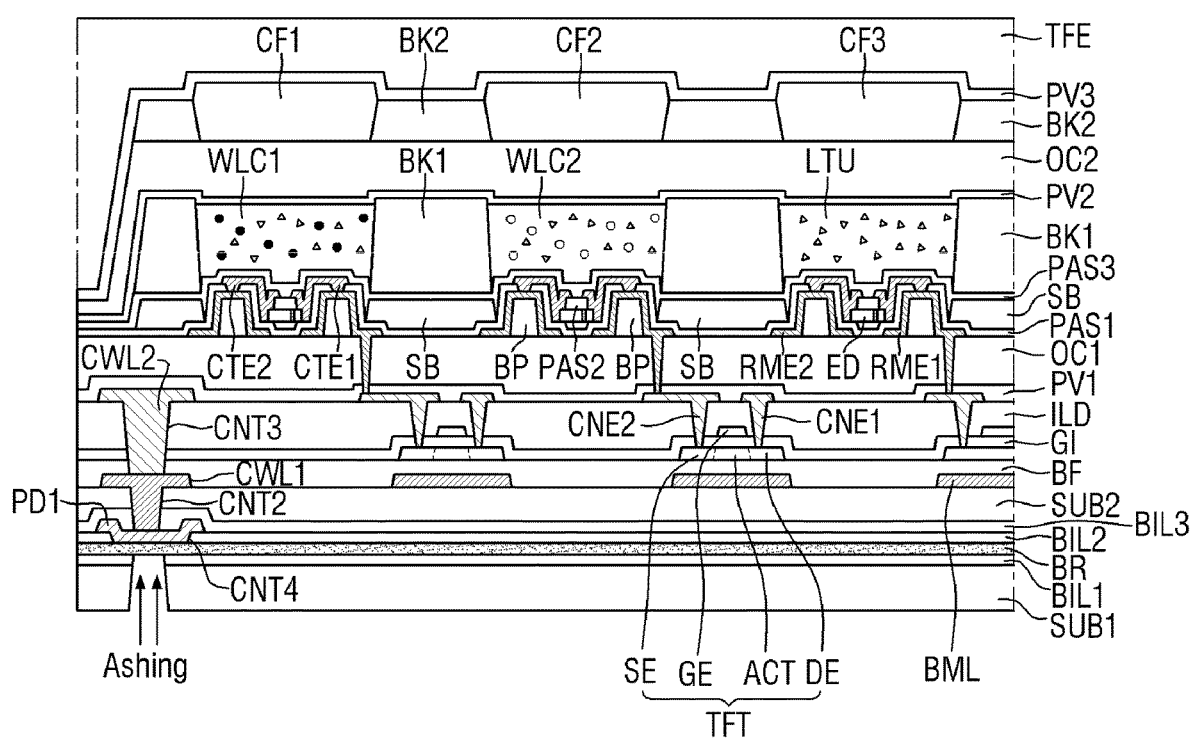
Figure 18:
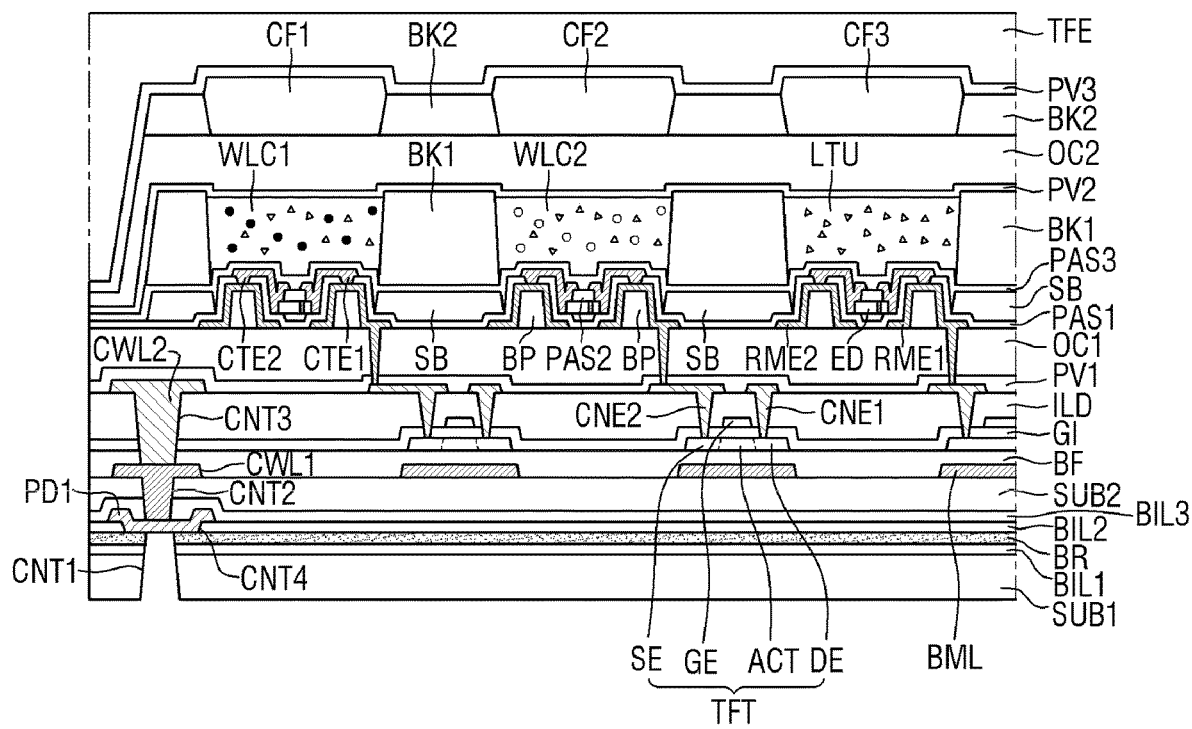

In FIGS. 17 and 18, the bottom surface of the barrier layer BR may be subjected to at least one of a dry etching process, a plasma etching process, or a laser etching process. For example, the barrier layer BR may be patterned by an ashing process using oxygen gas ($O_2$ gas). Therefore, the first contact hole CNT1 may be formed by sequential patterning of the first substrate SUB1, the first barrier insulating layer BILL and the barrier layer BR. A part of the bottom surface of the first pad part PD1 may be exposed through the first contact hole CNT1.

When the first pad part PD1 is directly disposed on the first substrate SUB1, the interface having weak adhesive strength is formed between the first pad part PD1 and the first substrate SUB1 and, thus, the film lifting phenomenon of the first pad part PD1 may occur in the manufacturing process of the display device 10. Since the display device 10 includes the second barrier insulating layer BIL2 and the first pad part PD1 disposed on the barrier layer BR, it is possible to prevent the film lifting phenomenon of the first pad part PD1 in the manufacturing process of the display device 10.

Figure 19:
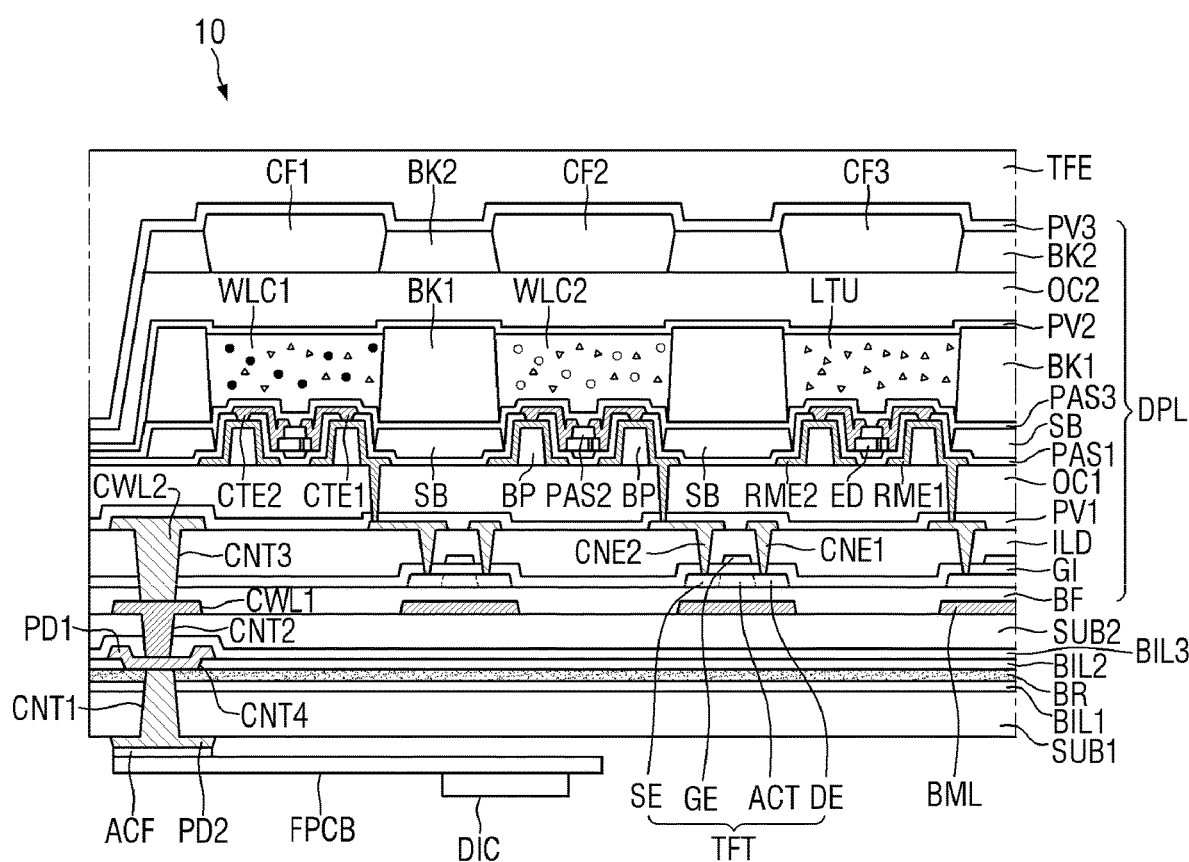

In FIG. 19, the second pad part PD2 may be disposed on the bottom surface of the first substrate SUB1. The second pad part PD2 may be inserted into the first contact hole CNT1 and connected to the first pad part PD1. The second pad part PD2 may receive various voltages or signals from the flexible film FPCB, and supply the corresponding voltages or signals to the first pad part PD1, the first connection line CWL1, and the second connection line CWL2.

The flexible film FPCB may be disposed on the bottom surface of the first substrate SUB1. One side of the flexible film FPCB may be connected to the second pad part PD2, and the other side of the flexible film FPCB may be connected to the source circuit board (not shown) on the bottom surface of the first substrate SUB1. The flexible film FPCB may transmit the signal of the data driver DIC to the display device 10. Since the display device 10 includes the first pad part PD1 disposed on the second barrier insulating layer BIL2, the second pad part PD2 disposed on the bottom surface of the first substrate SUB1, and the flexible film FPCB connected to the second pad part PD2, it is possible to minimize the non-display area NDA in size.

Figure 20:
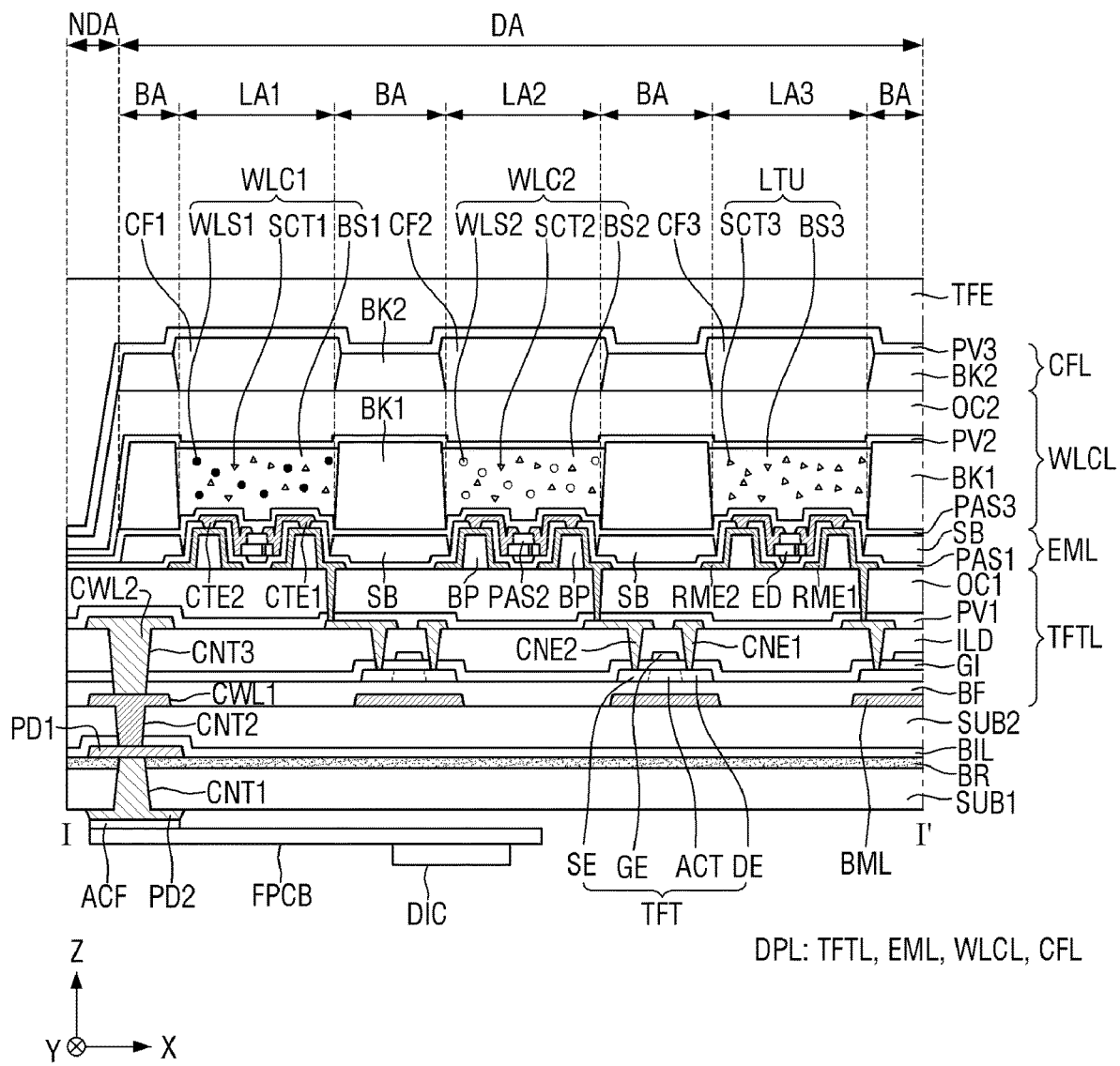
FIG. 20 is a cross-sectional view of still another example taken along line I-I' of FIG. 2.

FIG. 20 is a cross-sectional view of still another example taken along line I-I' of FIG. 2. The display device of FIG. 20 is different from the display device of FIG. 3 in the configuration of the barrier insulating layer BIL and the arrangement of the barrier layer BR, so that the same configuration as the above-described configuration will be briefly described, or a description thereof will be omitted.

Referring to FIG. 20, the display device 10 may include the first substrate SUB1, the barrier layer BR, the first pad part PD1, the barrier insulating layer BIL, the second substrate SUB2, the display layer DPL, the encapsulation layer TFE, the second pad part PD2, the connection film ACF, the flexible film FPCB, and the data driver DIC.

The first substrate SUB1 may support the display device 10. The first substrate SUB1 may be a base substrate or a base member. For example, the first substrate SUB1 may include an insulating material such as a polymer resin such as polyimide (PI), but the present disclosure is not limited thereto.

The barrier layer BR may be disposed on the first substrate SUB1. The barrier layer BR may be deposited on the first substrate SUB1 using plasma enhanced chemical vapor deposition (PECVD), but the present disclosure is not limited thereto. The barrier layer BR may protect the bottom surface of the first pad part PD1 in the process of forming the first contact hole CNT1. The barrier layer BR may contain amorphous carbon. The barrier layer BR may be patterned by a dry etching process using oxygen gas ($O_2$ gas). The barrier layer BR may block the transfer of heat or gas generated from the first substrate SUB1 to the first pad part PD1 in the manufacturing process of the display device 10. Therefore, the barrier layer BR may prevent the film lifting phenomenon of the first pad part PD1 by preventing changes in the characteristics of the first pad part PD1 due to the heat or the gas in the manufacturing process of the display device 10.

When the first pad part PD1 is directly disposed on the first substrate SUB1, the interface having weak adhesive strength is formed between the first pad part PD1 and the first substrate SUB1 and, thus, the film lifting phenomenon of the first pad part PD1 may occur in the manufacturing process of the display device 10. Since the display device 10 includes the first pad part PD1 disposed on the barrier layer BR, it is possible to prevent the film lifting phenomenon of the first pad part PD1 in the manufacturing process of the display device 10.

The first substrate SUB1 and the barrier layer BR may include the first contact hole CNT1. The first contact hole CNT1 may be patterned from the bottom surface of the first substrate SUB1 to penetrate the top surface of the barrier layer BR. For example, the lower width of the first contact hole CNT1 may be greater than the upper width of the first contact hole CNT1. That is, the first contact hole CNT1 may have a tapered shape.

The first pad part PD1 may be disposed on one surface or the top surface of the barrier layer BR. The first pad part PD1 may not be inserted into the first contact hole CNT1. The first pad part PD1 may be connected to the first connection line CWL1 inserted into the second contact hole CNT2. The first pad part PD1 may be electrically connected to the flexible film FPCB through the second pad part PD2 inserted into the first contact hole CNT1. The first pad part PD1 may supply the electrical signal received from the flexible film FPCB to the first connection line CWL1.

The barrier insulating layer BIL may be disposed on the barrier layer BR and the first pad part PD1. The barrier insulating layer BIL may include an inorganic layer capable of preventing permeation of air or moisture. For example, the barrier insulating layer BIL may include at least one of a silicon nitride layer, a silicon oxynitride layer, a silicon oxide layer, a titanium oxide layer, or an aluminum oxide layer, but the present disclosure is not limited thereto.

The second substrate SUB2 may be disposed on the barrier insulating layer BIL. The second substrate SUB2 may be a base substrate or a base member. For example, the second substrate SUB2 may include an insulating material such as a polymer resin such as polyimide (PI), but the present disclosure is not limited thereto.

The barrier insulating layer BIL and the second substrate SUB2 may include the second contact hole CNT2. The second contact hole CNT2 may be etched from the top surface of the second substrate SUB2 to penetrate the bottom surface of the barrier insulating layer BIL. For example, the upper width of the second contact hole CNT2 may be greater than the lower width of the second contact hole CNT2. That is, the second contact hole CNT2 may have a tapered shape. The second contact hole CNT2 may overlap the first contact hole CNT1 in the thickness direction (Z-axis direction), but the present disclosure is not limited thereto.

The display layer DPL may be disposed on the second substrate SUB2. The thin film transistor layer TFTL, the light emitting element layer EML, the wavelength conversion layer WLCL, and the color filter layer CFL may be sequentially stacked on the second substrate SUB2. The encapsulation layer TFE may cover the top and side surfaces of the display layer DPL.

The second pad part PD2 may be disposed on the bottom surface of the first substrate SUB1. The second pad part PD2 may be inserted into the first contact hole CNT1 and connected to the first pad part PD1. The second pad part PD2 may receive various voltages or signals from the flexible film FPCB, and supply the corresponding voltages or signals to the first pad part PD1, the first connection line CWL1, and the second connection line CWL2.

The connection film ACF may attach the flexible film FPCB to the bottom surface of the second pad part PD2. One surface of the connection film ACF may be attached to the second pad part PD2, and the other surface of the connection film ACF may be attached to the flexible film FPCB. For example, the connection film ACF may include an anisotropic conductive film. The connection film ACF may electrically connect the flexible film FPCB to the second pad part PD2.

The flexible film FPCB may be disposed on the bottom surface of the first substrate SUB1. One side of the flexible film FPCB may be connected to the second pad part PD2, and the other side of the flexible film FPCB may be connected to the source circuit board (not shown) on the bottom surface of the first substrate SUB1. The flexible film FPCB may transmit the signal of the data driver DIC to the display device 10. For example, the data driver DIC may be an integrated circuit (IC). The data driver DIC may convert digital video data to an analog data voltage based on the data control signal of the timing controller, and may supply the analog data voltage to the data line of the display area DA through the flexible film FPCB. Since the display device 10 includes the first pad part PD1 disposed on the barrier layer BR, the second pad part PD2 disposed on the bottom surface of the first substrate SUB1, and the flexible film FPCB connected to the second pad part PD2, it is possible to minimize the non-display area NDA in size.

FIGS. 21, 22, 23, 24, 25, and 26 are cross-sectional views showing a manufacturing process of a display device according to still another embodiment.

Figure 21:
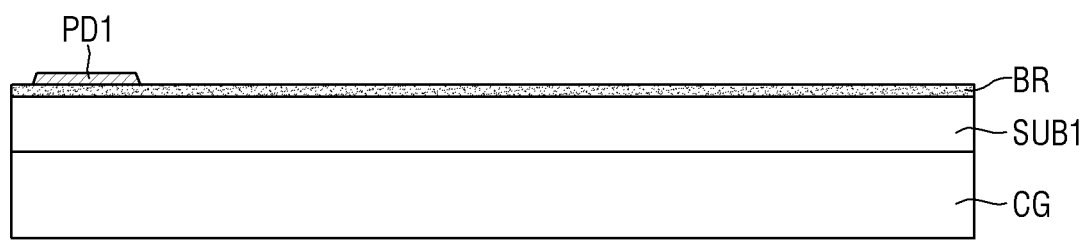
FIGS. 21, 22, 23, 24, 25, and 26 are cross-sectional views showing a manufacturing process of a display device according to still another embodiment.

In FIG. 21, the carrier substrate CG may support the display device 10 in the manufacturing process of the display device 10. For example, the carrier substrate CG may be a carrier glass, but the present disclosure is not limited thereto.

The first substrate SUB1 may be disposed on the carrier substrate CG. The first substrate SUB1 may be a base substrate or a base member. For example, the first substrate SUB1 may include an insulating material such as a polymer resin such as polyimide (PI), but the present disclosure is not limited thereto.

The barrier layer BR may be disposed on the first substrate SUB1. The barrier layer BR may contain amorphous carbon. The barrier layer BR may be deposited on the first substrate SUB1 using plasma enhanced chemical vapor deposition (PECVD), but the present disclosure is not limited thereto.

The first pad part PD1 may be disposed on one surface or the top surface of the barrier layer BR.

Figure 22:

In FIG. 22, the barrier insulating layer BIL may be disposed on the barrier layer BR and the first pad part PD1. The barrier insulating layer BIL may include an inorganic layer capable of preventing permeation of air or moisture. For example, the barrier insulating layer BIL may include at least one of a silicon nitride layer, a silicon oxynitride layer, a silicon oxide layer, a titanium oxide layer, or an aluminum oxide layer, but the present disclosure is not limited thereto.

The second substrate SUB2 may be disposed on the barrier insulating layer BIL. The second substrate SUB2 may be a base substrate or a base member. For example, the second substrate SUB2 may include an insulating material such as a polymer resin such as polyimide (PI), but the present disclosure is not limited thereto.

The second contact hole CNT2 may be defined in the barrier insulating layer BIL and the second substrate SUB2. The second contact hole CNT2 may be etched from the top surface of the second substrate SUB2 to penetrate the bottom surface of the barrier insulating layer BIL. For example, the upper width of the second contact hole CNT2 may be greater than the lower width of the second contact hole CNT2. That is, the second contact hole CNT2 may have a tapered shape.

Figure 23:
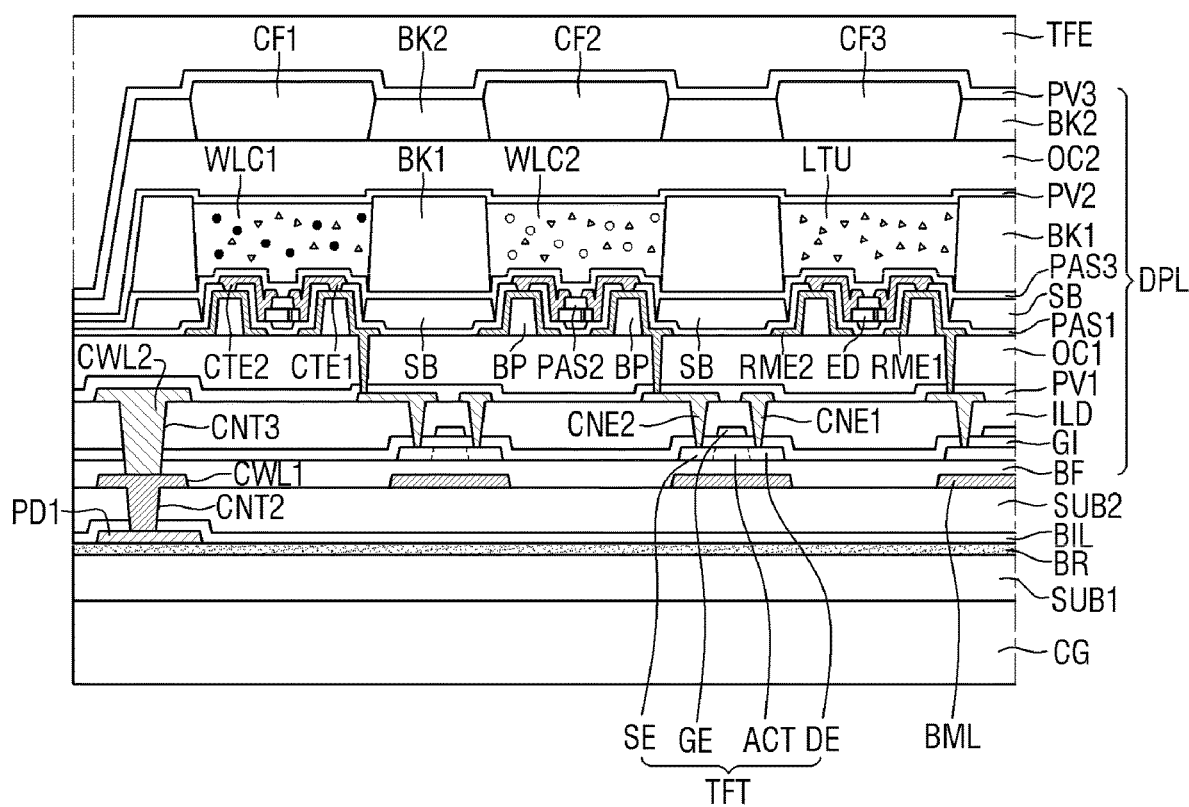

In FIG. 23, the display layer DPL may be stacked on the second substrate SUB2. The thin film transistor layer TFTL, the light emitting element layer EML, the wavelength conversion layer WLCL, and the color filter layer CFL may be sequentially stacked on the second substrate SUB2. The encapsulation layer TFE may cover the top and side surfaces of the display layer DPL.

Figure 24:
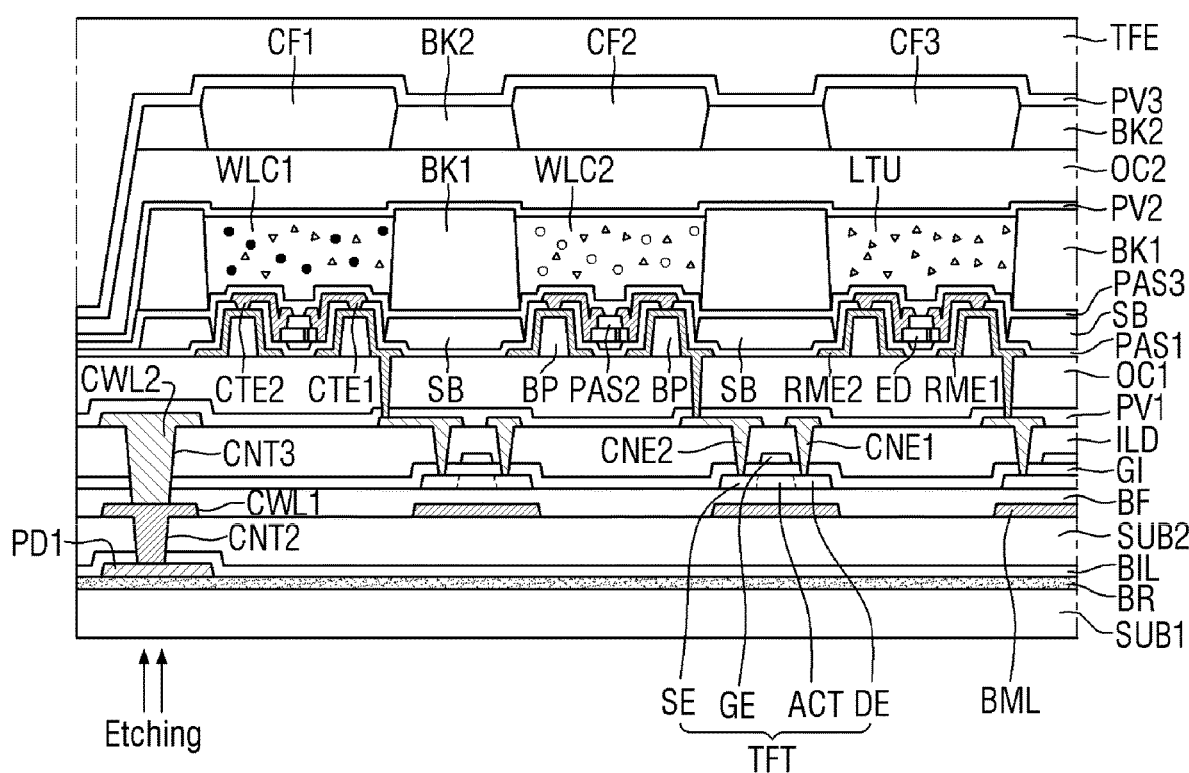
Figure 25:
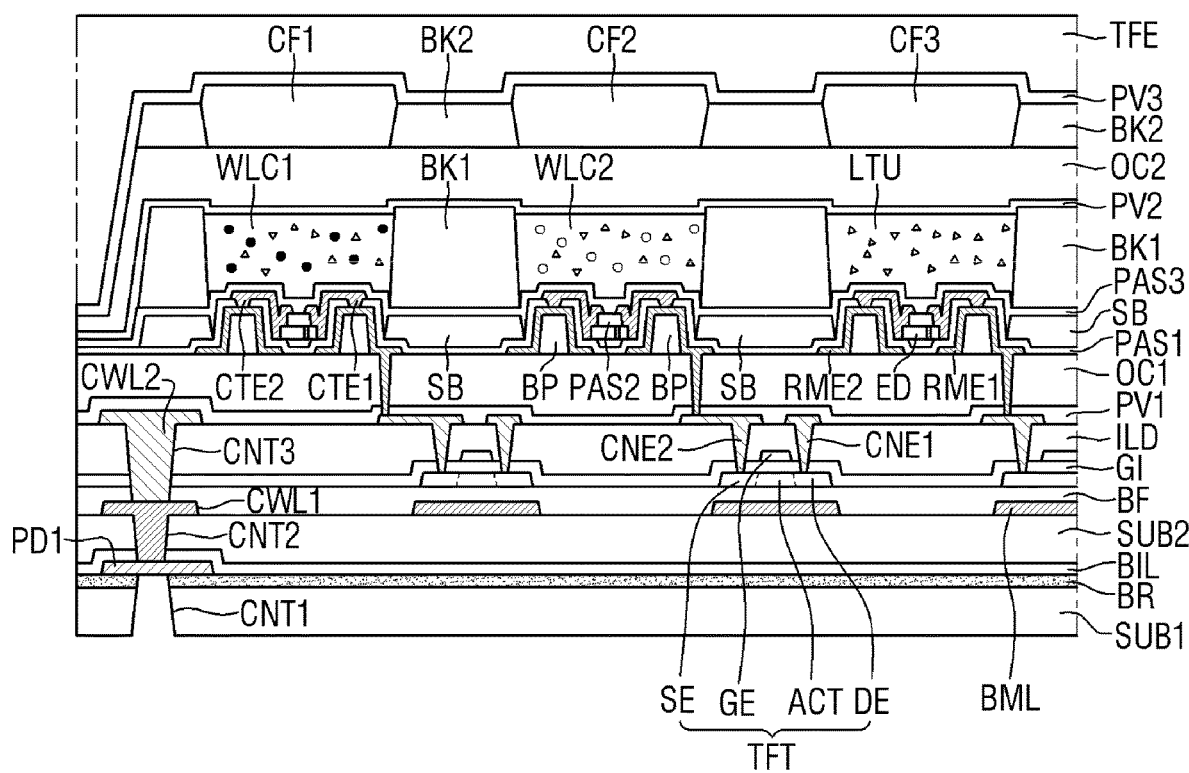

In FIGS. 24 and 25, the carrier substrate CG may be removed from the bottom surface of the first substrate SUB1. For example, the carrier substrate CG may be removed from the bottom surface of the first substrate SUB1 using the sacrificial layer (not shown) disposed between the carrier substrate CG and the first substrate SUB1, but the present disclosure is not limited thereto.

The first substrate SUB1 and the barrier layer BR may be subjected to at least one of a dry etching process, a plasma etching process, and a laser etching process. For example, the first substrate SUB1 and the barrier layer BR may be patterned by a dry etching process using oxygen gas ($O_2$ gas). The first contact hole CNT1 may be formed by simultaneously etching the first substrate SUB1 and the barrier layer BR. Therefore, the reliability of the etching process of the first contact hole CNT1 may be improved. A part of the bottom surface of the first pad part PD1 may be exposed through the first contact hole CNT1.

The barrier layer BR may block the transfer of heat or gas generated from the first substrate SUB1 to the first pad part PD1 in the manufacturing process of the display device 10. Therefore, the barrier layer BR may prevent the film lifting phenomenon of the first pad part PD1 by preventing changes in the characteristics of the first pad part PD1 due to the heat or the gas in the manufacturing process of the display device 10.

When the first pad part PD1 is directly disposed on the first substrate SUB1, the interface having weak adhesive strength is formed between the first pad part PD1 and the first substrate SUB1 and, thus, the film lifting phenomenon of the first pad part PD1 may occur in the manufacturing process of the display device 10. Since the display device 10 includes the first pad part PD1 disposed on the barrier layer BR, it is possible to prevent the film lifting phenomenon of the first pad part PD1 in the manufacturing process of the display device 10.

Figure 26:
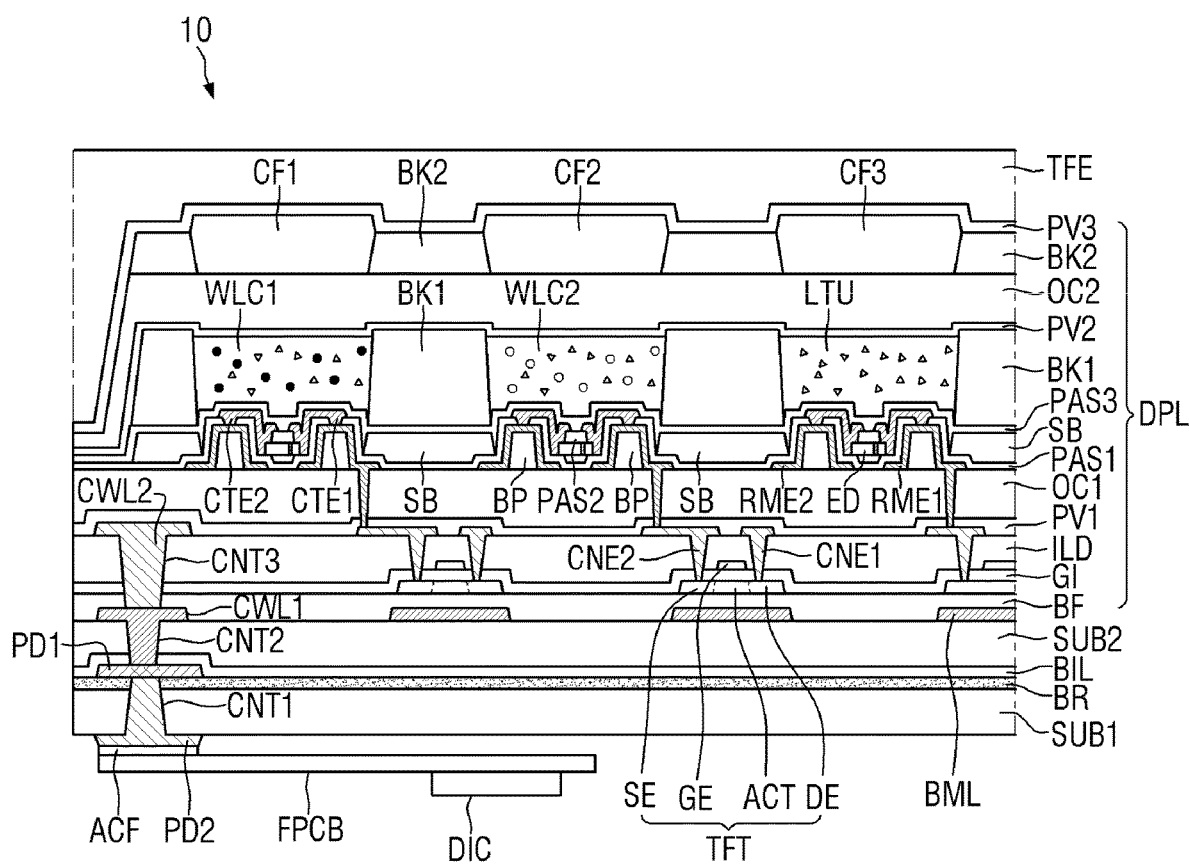

In FIG. 26, the second pad part PD2 may be disposed on the bottom surface of the first substrate SUB1. The second pad part PD2 may be inserted into the first contact hole CNT1 and connected to the first pad part PD1. The second pad part PD2 may receive various voltages or signals from the flexible film FPCB, and supply the corresponding voltages or signals to the first pad part PD1, the first connection line CWL1, and the second connection line CWL2.

Since the display device 10 includes the first pad part PD1 disposed on the barrier layer BR, the second pad part PD2 disposed on the bottom surface of the first substrate SUB1, and the flexible film FPCB connected to the second pad part PD2, it is possible to minimize the non-display area NDA in size.

Figure 27:
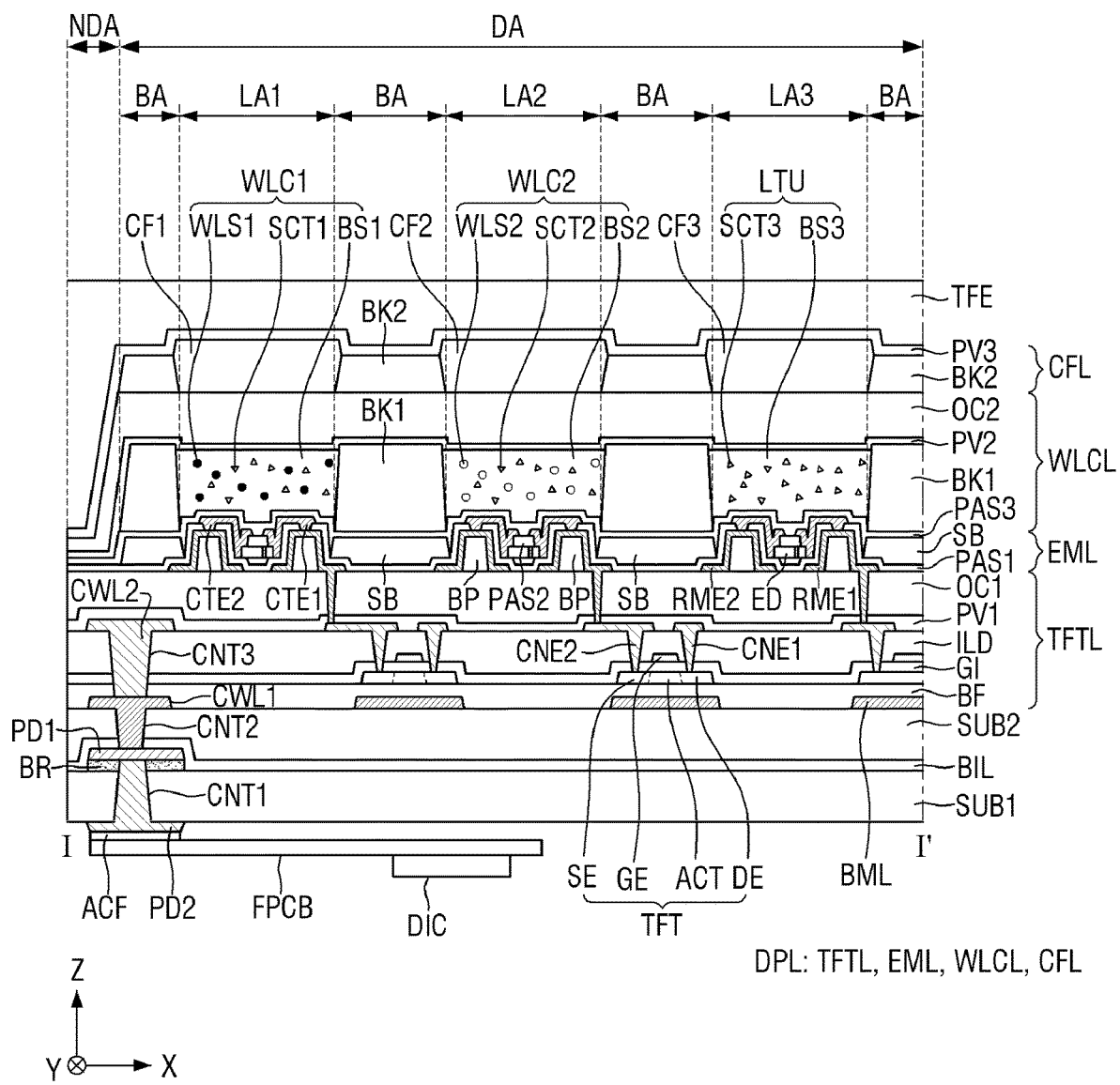
FIG. 27 is a cross-sectional view of still another example taken along line I-I' of FIG. 2.

FIG. 27 is a cross-sectional view of still another example taken along line I-I' of FIG. 2. The display device illustrated in FIG. 27 is different from the display device illustrated in FIG. 20 in the configuration of the barrier layer BR. A description of the same configuration as the above-described configuration will be briefly given or omitted.

Referring to FIG. 27, the display device 10 may include the first substrate SUB1, the barrier layer BR, the first pad part PD1, the barrier insulating layer BIL, the second substrate SUB2, the display layer DPL, the encapsulation layer TFE, the second pad part PD2, the connection film ACF, the flexible film FPCB, and the data driver DIC.

The barrier layer BR may be disposed on the first substrate SUB1. The barrier layer BR may be deposited on the first substrate SUB1 using plasma enhanced chemical vapor deposition (PECVD), but the present disclosure is not limited thereto. The barrier layer BR may be patterned to correspond to the first pad part PD1. For example, the portion of the barrier layer BR that does not overlap the first pad part PD1 may be removed. The barrier layer BR may protect the bottom surface of the first pad part PD1 in the process of forming the first contact hole CNT1. The barrier layer BR may contain amorphous carbon. In the process of forming the first contact hole CNT1, the barrier layer BR may be patterned by a dry etching process using oxygen gas ($O_2$ gas). The barrier layer BR may block the transfer of heat or gas generated from the first substrate SUB1 to the first pad part PD1 in the manufacturing process of the display device 10. Therefore, the barrier layer BR may prevent the film lifting phenomenon of the first pad part PD1 by preventing changes in the characteristics of the first pad part PD1 due to the heat or the gas in the manufacturing process of the display device 10.

When the first pad part PD1 is directly disposed on the first substrate SUB1, the interface having weak adhesive strength is formed between the first pad part PD1 and the first substrate SUB1 and, thus, the film lifting phenomenon of the first pad part PD1 may occur in the manufacturing process of the display device 10. Since the display device 10 includes the first pad part PD1 disposed on the barrier layer BR, it is possible to prevent the film lifting phenomenon of the first pad part PD1 in the manufacturing process of the display device 10.

The first substrate SUB1 and the barrier layer BR may include the first contact hole CNT1. The first contact hole CNT1 may be patterned from the bottom surface of the first substrate SUB1 to penetrate the top surface of the barrier layer BR. For example, the lower width of the first contact hole CNT1 may be greater than the upper width of the first contact hole CNT1. That is, the first contact hole CNT1 may have a tapered shape.

The first pad part PD1 may be disposed on one surface or the top surface of the barrier layer BR. The first pad part PD1 may not be inserted into the first contact hole CNT1. The first pad part PD1 may be connected to the first connection line CWL1 inserted into the second contact hole CNT2. The first pad part PD1 may be electrically connected to the flexible film FPCB through the second pad part PD2 inserted into the first contact hole CNT1. The first pad part PD1 may supply the electrical signal received from the flexible film FPCB to the first connection line CWL1.

The second pad part PD2 may be disposed on the bottom surface of the first substrate SUB1. The second pad part PD2 may be inserted into the first contact hole CNT1 and connected to the bottom of the first pad part PD1. The second pad part PD2 may receive various voltages or signals from the flexible film FPCB, and supply the corresponding voltages or signals to the first pad part PD1, the first connection line CWL1, and the second connection line CWL2.

FIGS. 28, 29, 30, 31, 32, and 33 are cross-sectional views illustrating a manufacturing process of a display device according to still another embodiment.

Figure 28:
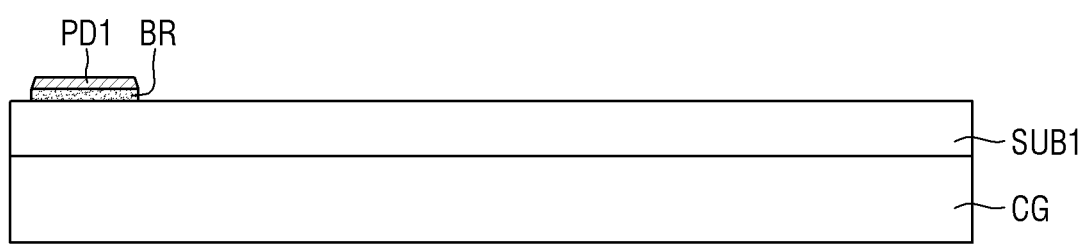
FIGS. 28, 29, 30, 31, 32, and 33 are cross-sectional views illustrating a manufacturing process of a display device according to still another embodiment.

In FIG. 28, the carrier substrate CG may support the display device 10 in the manufacturing process of the display device 10. For example, the carrier substrate CG may be a carrier glass, but the present disclosure is not limited thereto.

The first substrate SUB1 may be disposed on the carrier substrate CG. The first substrate SUB1 may be a base substrate or a base member. For example, the first substrate SUB1 may include an insulating material such as a polymer resin such as polyimide (PI), but the present disclosure is not limited thereto.

The barrier layer BR may be disposed on the first substrate SUB1. The barrier layer BR may contain amorphous carbon. The barrier layer BR may be deposited on the first substrate SUB1 using plasma enhanced chemical vapor deposition (PECVD), but the present disclosure is not limited thereto. The barrier layer BR may be patterned to correspond to the region where the first pad part PD1 is formed. For example, the portion of the barrier layer BR where the first pad part PD1 is not formed may be removed. The first pad part PD1 may be disposed on one surface or the top surface of the barrier layer BR.

Figure 29:
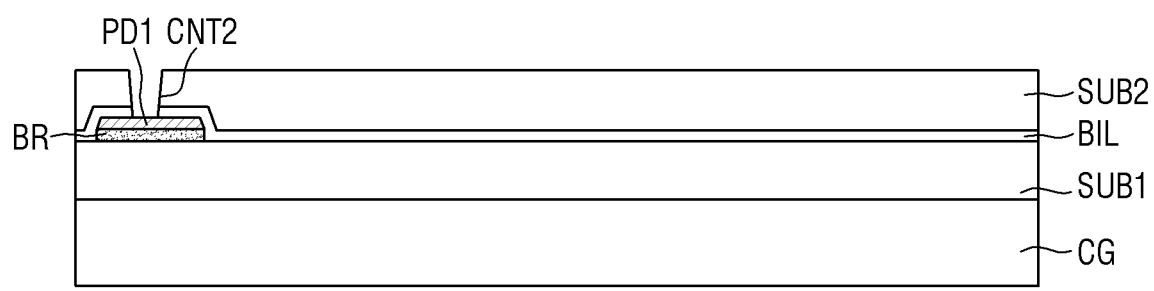

In FIG. 29, the barrier insulating layer BIL may be disposed on the barrier layer BR and the first pad part PD1. The barrier insulating layer BIL may include an inorganic layer capable of preventing permeation of air or moisture.

The second substrate SUB2 may be disposed on the barrier insulating layer BIL. The second substrate SUB2 may be a base substrate or a base member. For example, the second substrate SUB2 may include an insulating material such as a polymer resin such as polyimide (PI), but the present disclosure is not limited thereto.

The second contact hole CNT2 may be defined in the barrier insulating layer BIL and the second substrate SUB2. The second contact hole CNT2 may be etched from the top surface of the second substrate SUB2 to penetrate the bottom surface of the barrier insulating layer BIL. For example, the upper width of the second contact hole CNT2 may be greater than the lower width of the second contact hole CNT2. That is, the second contact hole CNT2 may have a tapered shape.

Figure 30:
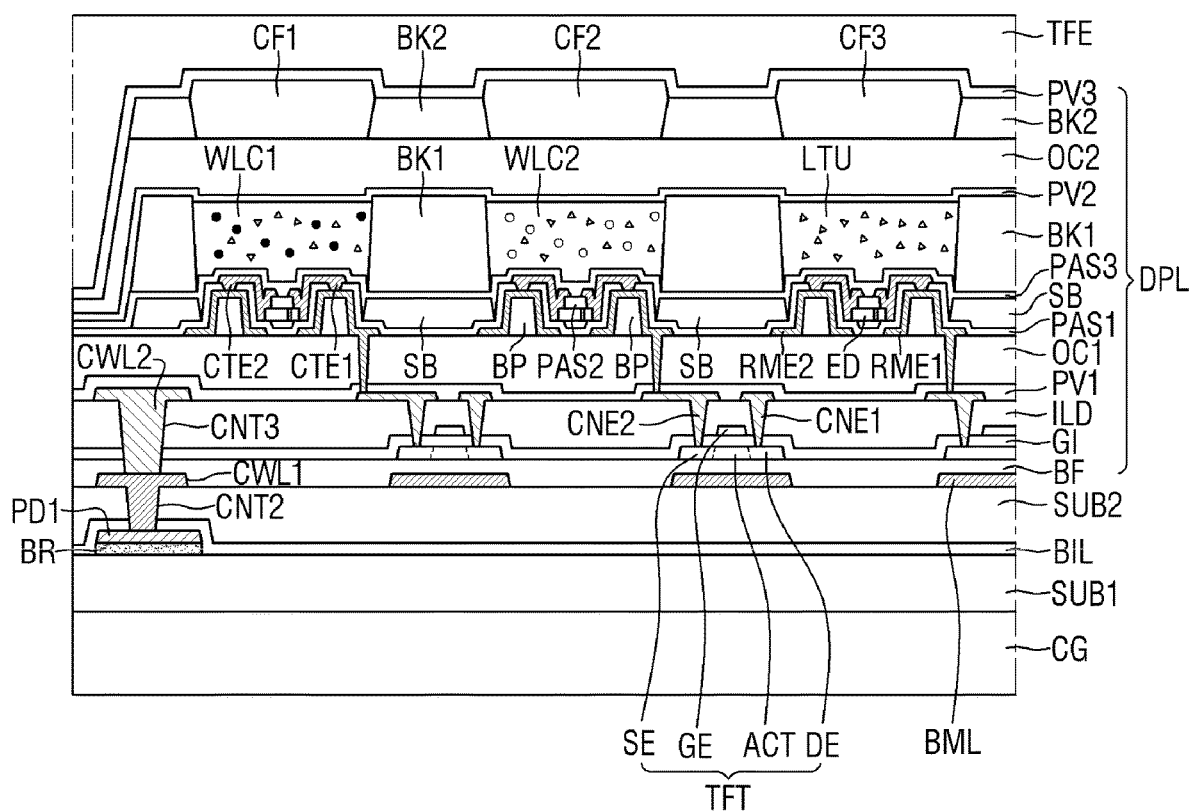

In FIG. 30, the display layer DPL may be stacked on the second substrate SUB2. The thin film transistor layer TFTL, the light emitting element layer EML, the wavelength conversion layer WLCL, and the color filter layer CFL may be sequentially stacked on the second substrate SUB2. The encapsulation layer TFE may cover the top and side surfaces of the display layer DPL.

Figure 31:
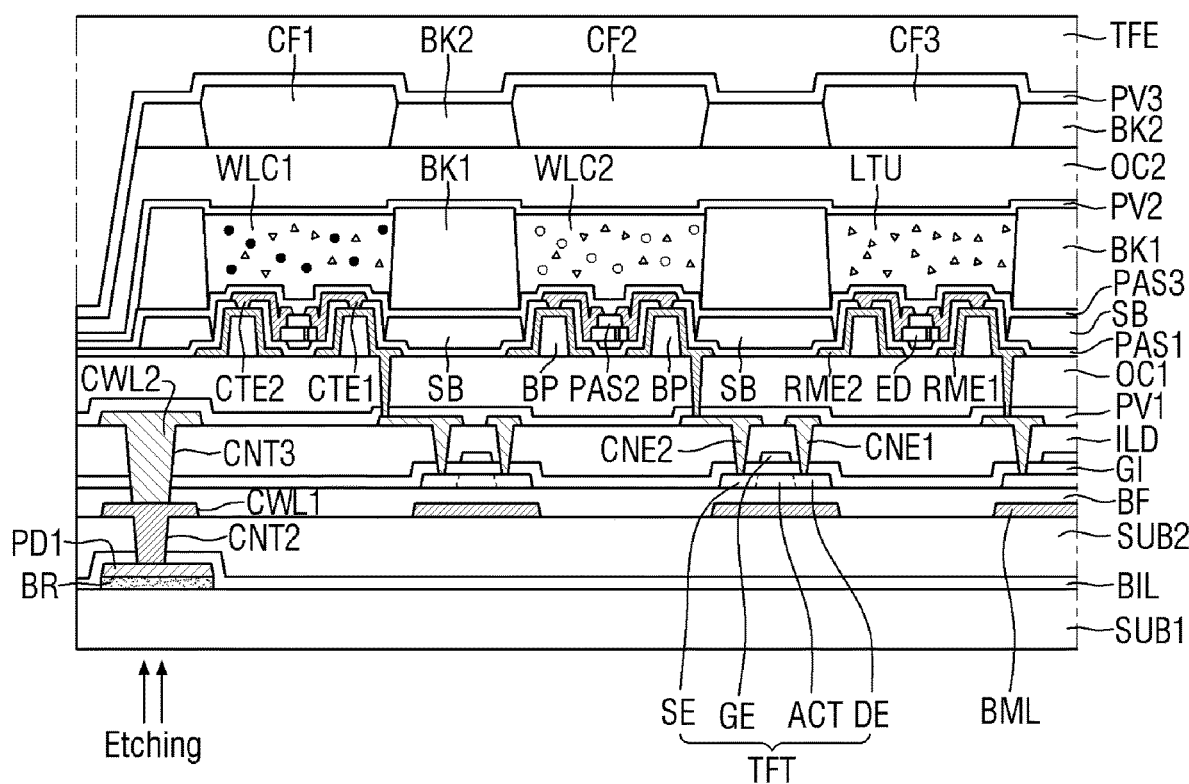
Figure 32:
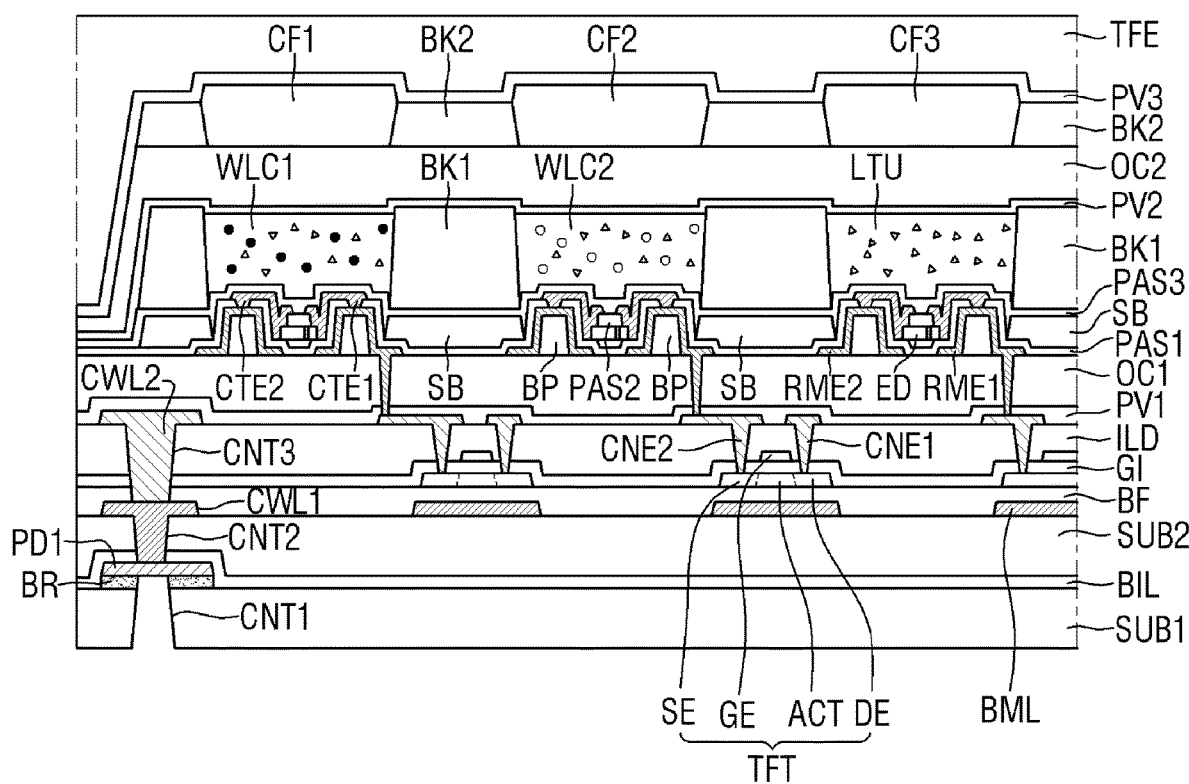

In FIGS. 31 and 32, the carrier substrate CG may be removed from the bottom surface of the first substrate SUB1. For example, the carrier substrate CG may be removed from the bottom surface of the first substrate SUB1 using the sacrificial layer (not shown) disposed between the carrier substrate CG and the first substrate SUB1, but the present disclosure is not limited thereto.

The first substrate SUB1 and the barrier layer BR may be subjected to at least one of a dry etching process, a plasma etching process, or a laser etching process. For example, the first substrate SUB1 and the barrier layer BR may be patterned by a dry etching process using oxygen gas ($O_2$ gas). The first contact hole CNT1 may be formed by simultaneously etching the first substrate SUB1 and the barrier layer BR. Therefore, the reliability of the etching process of the first contact hole CNT1 may be improved. A part of the bottom surface of the first pad part PD1 may be exposed through the first contact hole CNT1.

The barrier layer BR may block the transfer of heat or gas generated from the first substrate SUB1 to the first pad part PD1 in the manufacturing process of the display device 10. Therefore, the barrier layer BR may prevent the film lifting phenomenon of the first pad part PD1 by preventing changes in the characteristics of the first pad part PD1 due to the heat or the gas in the manufacturing process of the display device 10.

When the first pad part PD1 is directly disposed on the first substrate SUB1, the interface having weak adhesive strength is formed between the first pad part PD1 and the first substrate SUB1 and, thus, the film lifting phenomenon of the first pad part PD1 may occur in the manufacturing process of the display device 10. Since the display device 10 includes the first pad part PD1 disposed on the barrier layer BR, it is possible to prevent the film lifting phenomenon of the first pad part PD1 in the manufacturing process of the display device 10.

Figure 33:
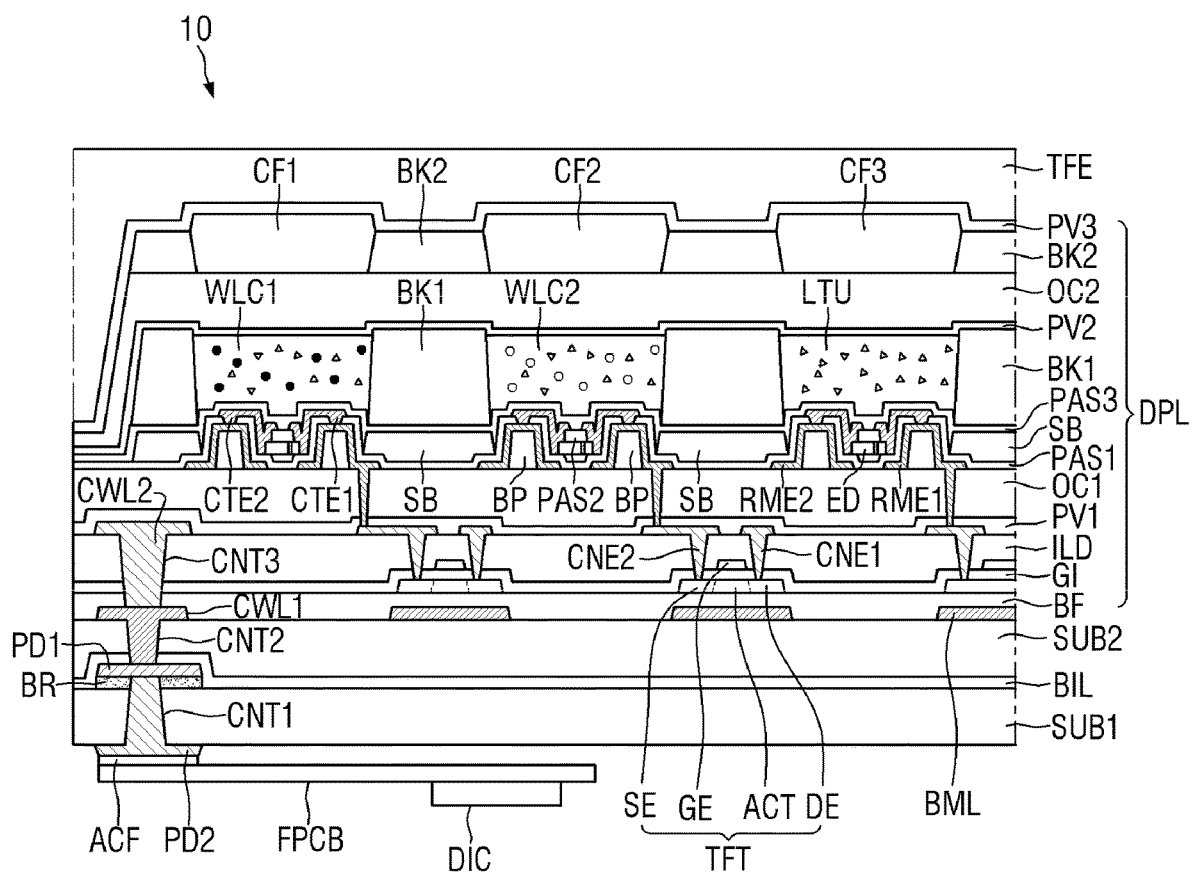

In FIG. 33, the second pad part PD2 may be disposed on the bottom surface of the first substrate SUB1. The second pad part PD2 may be inserted into the first contact hole CNT1 and connected to the first pad part PD1. The second pad part PD2 may receive various voltages or signals from the flexible film FPCB, and supply the corresponding voltages or signals to the first pad part PD1, the first connection line CWL1, and the second connection line CWL2.

Since the display device 10 includes the first pad part PD1 disposed on the barrier layer BR, the second pad part PD2 disposed on the bottom surface of the first substrate SUB1, and the flexible film FPCB connected to the second pad part PD2, it is possible to minimize the non-display area NDA in size.

Figure 34:
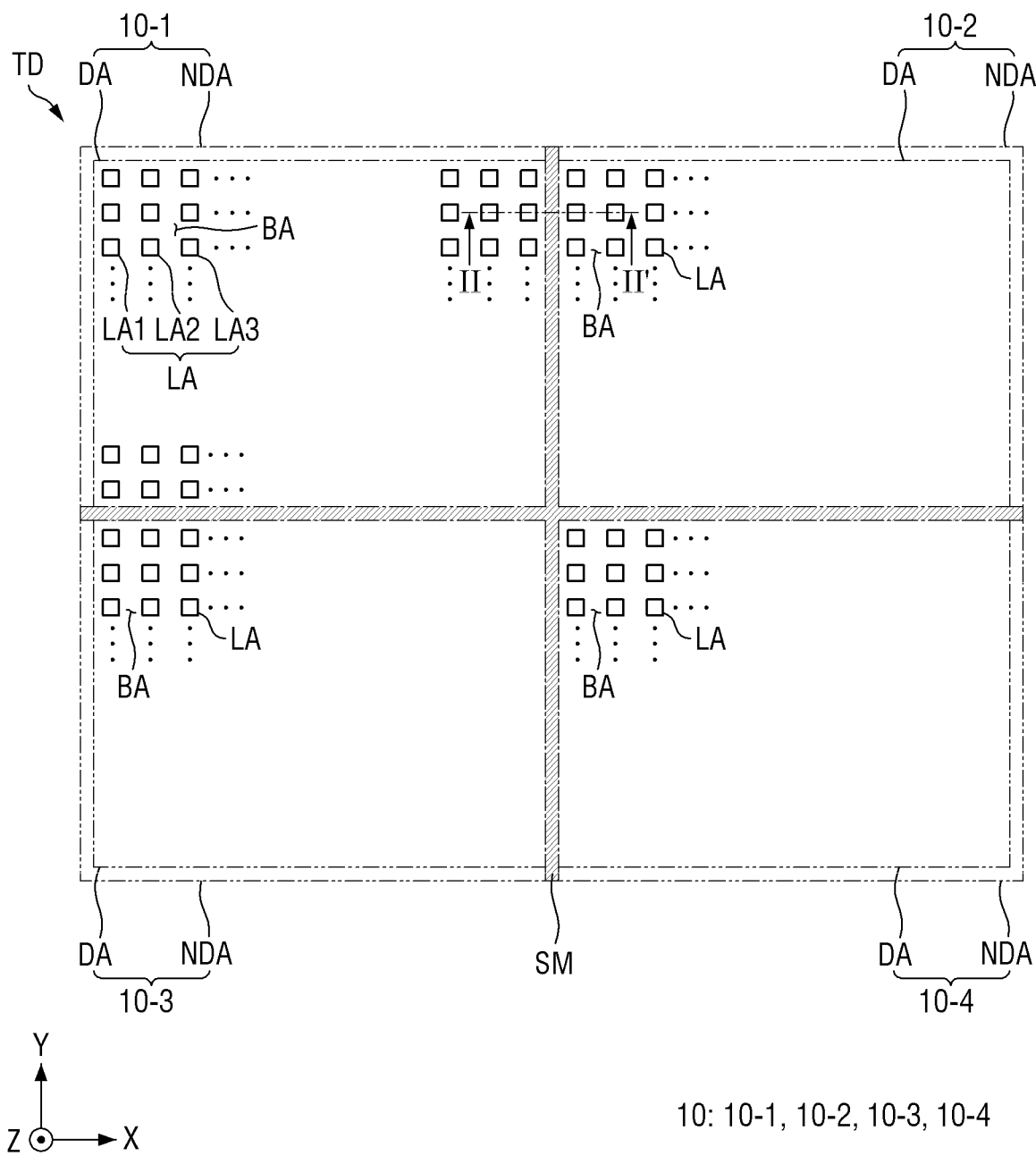
FIG. 34 is a plan view illustrating a bonding structure of a tiled display device according to one embodiment.
Figure 35:
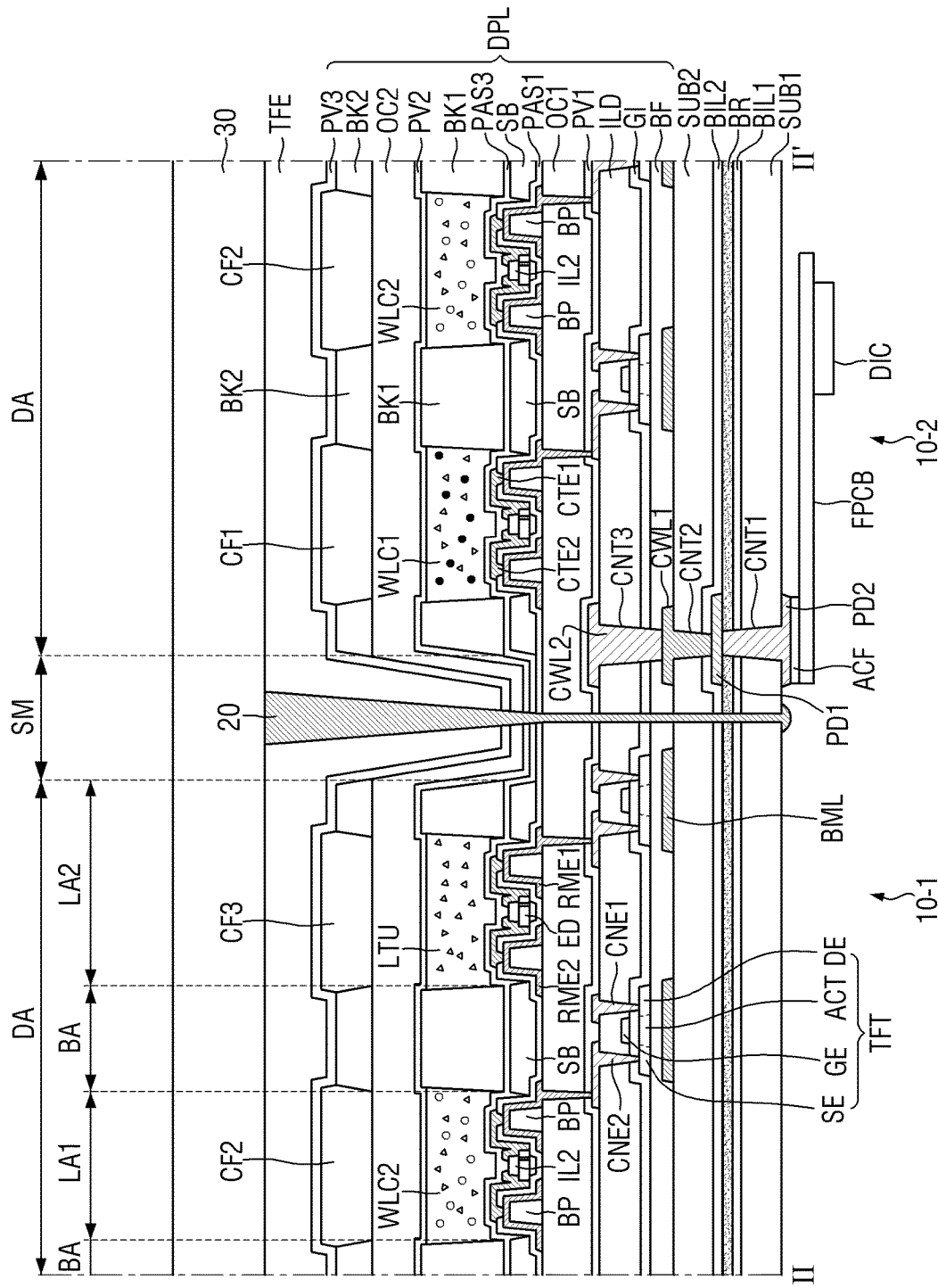
FIG. 35 is a cross-sectional view taken along line II-IT of FIG. 34.

FIG. 34 is a plan view illustrating a bonding structure of a tiled display device according to one embodiment, and FIG. 35 is a cross-sectional view taken along line II-IT of FIG. 34.

Referring to FIGS. 34 and 35, a tiled display device TD may include a plurality of display devices 10, a bonding member 20, and a cover member 30. The plurality of display devices 10 may be arranged in a grid form, but are not limited thereto. The plurality of display devices 10 may be connected in the first direction (X-axis direction) or the second direction (Y-axis direction), and the tiled display device TD may have a particular shape. For example, the plurality of display devices 10 may have the same size, but are not limited thereto. For another example, the plurality of display devices 10 may have different sizes.

The tiled display device TD may include first, second, third, and fourth display devices 10-1, 10-2, 10-3, and 10-4. The number and the bonding relationship of the display devices 10 are not limited to the embodiment of FIG. 34. The number of the display devices 10 may be determined according to the size of each of the display devices 10 and the tiled display device TD.

The display device 10 may include a display area DA and a non-display area NDA. The display area DA may include a plurality of pixels to display an image. The non-display area NDA may be disposed around the display area DA to surround the display area DA, and may not display an image.

The tiled display device TD may include a coupling area SM disposed between a plurality of display areas DA. The tiled display device TD may be formed by connecting non-display areas NDA of the adjacent display devices 10. The plurality of display devices 10 may be connected to each other through the bonding member 20 or an adhesive member disposed in the coupling area SM. Each of the coupling areas SM of the plurality of display devices 10 may not include a pad part or a flexible film attached to the pad part. Accordingly, the distance between the display areas DA of the plurality of display devices 10 may be small enough that the coupling area SM between the plurality of display devices 10 is not recognized by the user. In addition, the reflectance of external light of the display areas DA of the plurality of display devices 10 may be substantially the same as that of the coupling area SM between the plurality of display devices 10. Accordingly, in the tiled display device TD, the coupling area SM between the plurality of display devices 10 may be prevented from being recognized by the user, thereby reducing a sense of disconnection between the plurality of display devices 10 and improving a sense of immersion in an image.

The display device 10 may include a plurality of pixels arranged along a plurality of rows and columns in the display area DA. Each of the plurality of pixels may include an emission area LA defined by a pixel defining layer or bank, and may emit light having a predetermined peak wavelength through the emission area LA. For example, the display area DA of the display device 10 may include first, second, and third emission areas LA1, LA2, and LA3. Each of the first, second, and third emission areas LA1, LA2, and LA3 may be an area in which light generated from a light emitting element of the display device 10 is emitted to the outside of the display device 10.

The first, second, and third emission areas LA1, LA2, and LA3 may be sequentially arranged repetitively in the first direction (X-axis direction) in the display area DA. For example, the first emission area LA1 may be larger in size than the second emission area LA2, the second emission area LA2 may be larger in size than the third emission area LA3, and the third emission area LA3 may be larger than the first emission area LA1. For another example, the first emission area LA1, the second emission area LA2, and the third emission area LA3 may be substantially the same in size.

The display area DA of the display device 10 may include a light blocking area BA surrounding the plurality of emission areas LA. The light blocking area BA may prevent the colored lights emitted from the first, second, and third emission areas LA1, LA2, and LA3 from mixing with one another.

The tiled display device TD may bond the side surfaces of the adjacent display devices 10 to each other by using the bonding member 20 disposed between the plurality of display devices 10. The bonding member 20 may connect the side surfaces of the first, second, third, and fourth display devices 10-1, 10-2, 10-3, and 10-4 arranged in a grid form to implement the tiled display device TD. The bonding member 20 may bond the side surfaces of the first substrates SUB1, the side surfaces of the first barrier insulating layers BIL1, the side surfaces of the barrier layers BR, the side surfaces of the second barrier insulating layers BIL2, the side surfaces of the second substrates SUB2, the side surfaces of the display layers DPL, and the side surfaces of the encapsulation layers TFE of the adjacent display devices 10.

For example, the bonding member 20 may be made of an adhesive or a double-sided tape having a relatively thin thickness to minimize the gap between the plurality of display devices 10. For another example, the bonding member 20 may be formed of a bonding frame having a relatively thin thickness to minimize the gap between the plurality of display devices 10. Accordingly, in the tiled display device TD, it is possible to prevent the user from recognizing the coupling area SM between the plurality of display devices 10.

The cover member 30 may be disposed on the top surfaces of the plurality of display devices 10 and the bonding member 20 to cover the plurality of display devices 10 and the bonding member 20. For example, the cover member 30 may be disposed on the top surface of the encapsulation layer TFE of each of the plurality of display devices 10. The cover member 30 may protect the top surface of the tiled display device TD.

What is claimed is:

1. A display device comprising:
   a first substrate;
   a barrier layer disposed on the first substrate and having amorphous carbon;
   a first pad part disposed on the barrier layer;
   a second substrate disposed on the first pad part;
   a display layer disposed on the second substrate;
   a second pad part disposed on a bottom surface of the first substrate and inserted into a first contact hole penetrating the first substrate and the barrier layer;
   a first connection line disposed on a first surface of the second substrate, and connected to the second pad part through a second contact hole penetrating the second substrate;
   a light blocking layer disposed on the first surface of the second substrate and spaced apart from the first connection line; and
   a buffer layer disposed on the first connection line, the light blocking layer, and the first surface of the second substrate,
   wherein the first connection line and the light blocking layer have a same material.

2. The display device of claim 1, further comprising a first barrier insulating layer disposed between the first substrate and the barrier layer, the first contact hole formed in the first barrier insulating layer.

3. The display device of claim 2, wherein with respect to fluorine-based gas, an etching rate of the first barrier insulating layer is higher than an etching rate of the barrier layer.

4. The display device of claim 2, further comprising a second barrier insulating layer disposed between the first pad part and the second substrate.

5. The display device of claim 4, wherein each of the first and second barrier insulating layers includes at least one of a silicon nitride layer, a silicon oxynitride layer, a silicon oxide layer, a titanium oxide layer, or an aluminum oxide layer.

6. The display device of claim 4, comprising a wherein the first connection line is connected to the first pad part through the second contact hole formed in the second substrate and the second barrier insulating layer.

7. The display device of claim 1, wherein the display layer includes:
   a thin film transistor layer disposed on the second substrate and including a thin film transistor;
   a light emitting element layer disposed on the thin film transistor layer and including a light emitting element; and
   a wavelength conversion layer disposed on the light emitting element layer to convert a wavelength of light emitted from the light emitting element.

8. The display device of claim 1, further comprising:
   a flexible film disposed on the bottom surface of the first substrate and connected to a bottom surface of the second pad part; and
   a data driver disposed on the flexible film configured to supply a data voltage to the first pad part.

9. The display device of claim 2, further comprising:
   a second barrier insulating layer disposed on the barrier layer; and
   a third barrier insulating layer disposed between the second barrier insulating layer and the second substrate;
   wherein the first connection line is connected to the first pad part through the second contact hole formed in the second substrate and the third barrier insulating layer.

10. The display device of claim 9, wherein the first pad part is disposed on the second barrier insulating layer, and is inserted into a third contact hole provided in the second barrier insulating layer to be contact with the barrier layer.

11. The display device of claim 1, wherein an etching rate of the barrier layer with respect to oxygen gas is higher than an etching rate of the barrier layer with respect to fluorine-based gas.

12. The display device of claim 1, wherein the barrier layer is patterned to correspond to the first pad part.

13. A tiled display device comprising:
   a plurality of display devices, each including a display area including a plurality of pixels and a non-display area surrounding the display area; and
   a bonding member configured to bond the plurality of display devices,
   wherein each of the plurality of display devices includes:
   a first substrate;
   a barrier layer disposed on the first substrate and having amorphous carbon;
   a first pad part disposed on the barrier layer;
   a second substrate disposed on the first pad part;
   a display layer disposed on the second substrate;
   a second pad part disposed on a bottom surface of the first substrate and inserted into a first contact hole penetrating the first substrate and the barrier layer;
   a first connection line disposed on a first surface of the second substrate, and connected to the second pad part through a second contact hole penetrating the second substrate;

a buffer layer disposed on the first connection line and the first surface of the second substrate;

a transistor comprising a source electrode and a drain electrode disposed on the buffer layer;

an insulating layer disposed on the source electrode and the drain electrode;

a second connection line disposed on the insulating layer and connected to the first connection line through a third contact hole penetrating the buffer layer and the insulating layer; and a connection electrode disposed on the insulating layer and connected to the source electrode or the drain electrode through a fourth contact hole penetrating the insulating layer, wherein the second connection line and the connection electrode have a same material.

14. The tiled display device of claim 13, wherein each of the plurality of display devices further includes a first barrier insulating layer disposed between the first substrate and the barrier layer, the first contact hole formed in the first barrier insulating layer, and with respect to fluorine-based gas, an etching rate of the first barrier insulating layer is higher than an etching rate of the barrier layer.

* * * * *